US006781439B2

(12) United States Patent
Tanzawa et al.

(10) Patent No.: US 6,781,439 B2
(45) Date of Patent: Aug. 24, 2004

(54) MEMORY DEVICE PUMP CIRCUIT WITH TWO BOOSTER CIRCUITS

(75) Inventors: Toru Tanzawa, Ebina (JP); Shigeru Atsumi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/178,303

(22) Filed: Jun. 25, 2002

(65) Prior Publication Data

US 2002/0153941 A1 Oct. 24, 2002

Related U.S. Application Data

(60) Continuation-in-part of application No. 09/874,206, filed on Jun. 6, 2001, now Pat. No. 6,429,725, which is a division of application No. 09/363,032, filed on Jul. 29, 1999, now Pat. No. 6,278,316.

(30) Foreign Application Priority Data

Jul. 30, 1998 (JP) ............................. 10-215635

(51) Int. Cl.[7] ............................. G05F 1/575; G11C 7/00
(52) U.S. Cl. .................................. 327/536; 365/189.09
(58) Field of Search ............................. 327/536, 537; 365/189.09, 227, 229, 233.5; 363/60

(56) References Cited

U.S. PATENT DOCUMENTS

| | | | | |
|---|---|---|---|---|
| 4,794,564 A | * | 12/1988 | Watanabe ............... | 365/185.22 |
| 5,168,174 A | | 12/1992 | Naso et al. | |
| 5,337,284 A | | 8/1994 | Cordoba et al. | |
| 5,367,489 A | | 11/1994 | Park et al. | |
| 5,434,820 A | * | 7/1995 | Kim ....................... | 365/189.09 |
| 5,493,249 A | | 2/1996 | Manning | |
| 5,553,021 A | * | 9/1996 | Kubono et al. .......... | 365/226 |
| 5,589,697 A | * | 12/1996 | Smayling et al. ........... | 327/537 |
| 5,877,651 A | * | 3/1999 | Furutani ..................... | 327/538 |
| 5,940,283 A | * | 8/1999 | Mihara et al. ................ | 363/60 |
| 6,038,190 A | * | 3/2000 | Kowalski et al. ........... | 365/228 |
| 6,041,011 A | * | 3/2000 | Umezawa et al. .......... | 365/226 |
| 6,052,022 A | * | 4/2000 | Lee ............................. | 327/589 |
| 6,154,411 A | * | 11/2000 | Morishita ................... | 365/226 |
| 6,195,307 B1 | * | 2/2001 | Umezawa et al. .......... | 365/226 |
| 6,201,437 B1 | | 3/2001 | Kono et al. | |
| 6,285,622 B1 | | 9/2001 | Haraguchi et al. | |
| 6,404,274 B1 | * | 6/2002 | Hosono et al. ............. | 327/538 |

OTHER PUBLICATIONS

Y. Miyawaki et al., "A New Erasing and Row Decoding Scheme for Low Supply Voltage Operation 16–Mb/64–Mb Flash Memories," (*IEEE J. Solid–State Circuits*, vol. 27, No. 4, Apr. 1992, pp, 583–588.

J. Dickson, "On–Chip High–Voltage Generation in NMOS Integrated Circuits Using an Improved Voltage Multiplier Technique," *IEEE J. Solid–State Circuits*, vol. SC–11, Jun. 1976, pp. 376–378.

J. Chen et al., "A 2.7V Only 8Mb×16 NOR Flash Memory," *1996 Symposium on VLSI Circuits Digest of Technical papers*, Jun. 1996, pp. 172–173.

* cited by examiner

*Primary Examiner*—Timothy P. Callahan
*Assistant Examiner*—Terry L. Englund
(74) *Attorney, Agent, or Firm*—Banner & Witcoff, Ltd.

(57) ABSTRACT

A standby-mode booster circuit is activated in both a standby mode and an active mode and boosts up a power supply voltage to generate a booster voltage and output it from an output terminal. An active-mode booster circuit is activated in the active mode. In the active-mode booster circuit, an NMOS transistor is first turned on in response to a reset signal supplied from a reset signal generation circuit and then a connection node of capacitors is reset to the power supply voltage by the NMOS transistor. The boost operation is then started to output the booster voltage from the output terminal.

21 Claims, 11 Drawing Sheets

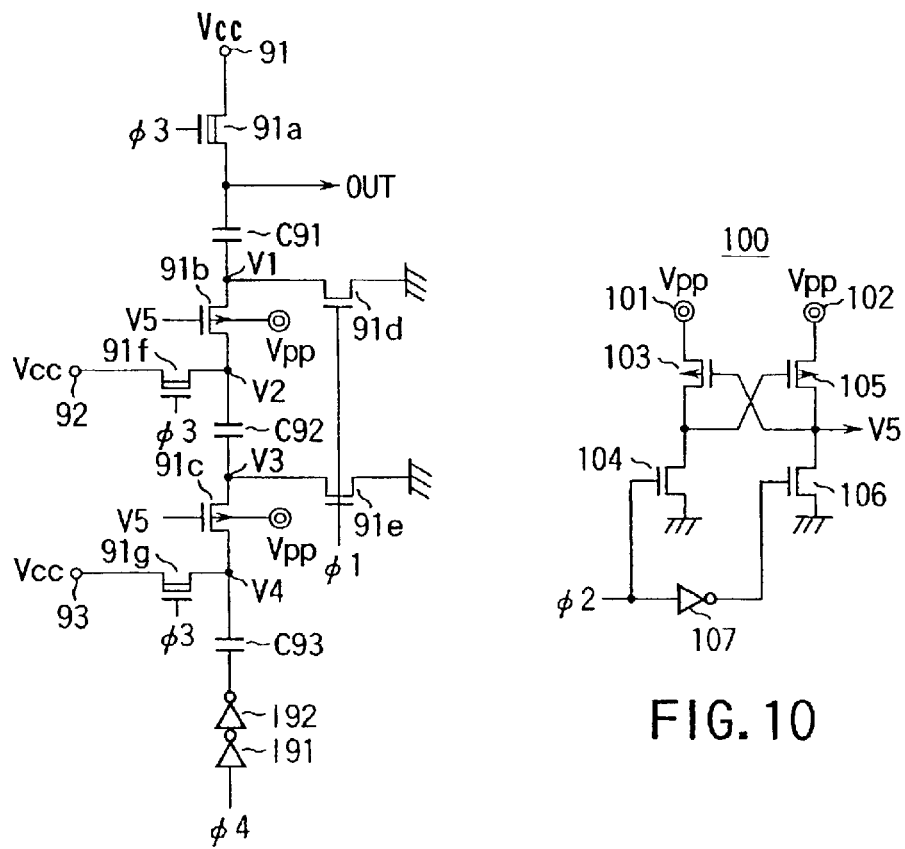
FIG. 9
FIG. 10
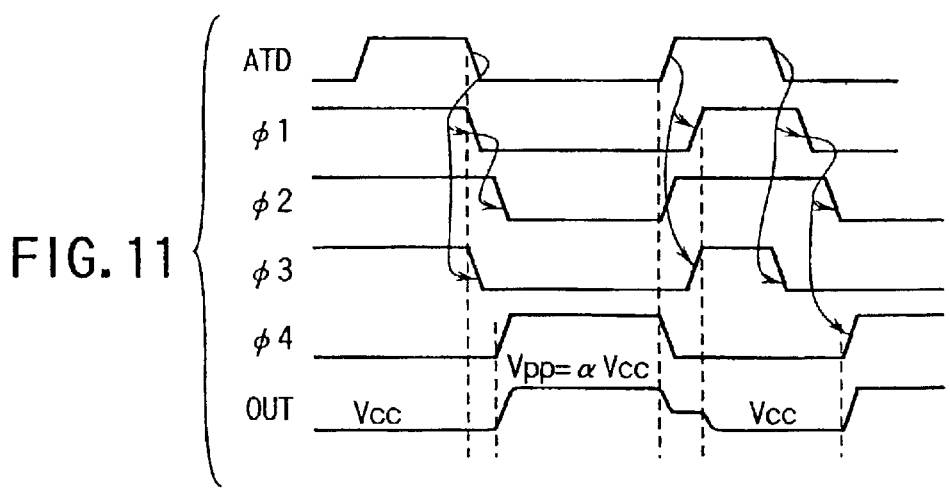
FIG. 11

MEMORY DEVICE PUMP CIRCUIT WITH TWO BOOSTER CIRCUITS

CROSS REFERENCE TO RELATED APPLICATIONS

This application is a continuation of prior application Ser. No. 09/874,206, Jun. 6, 2001, now U.S. Pat. No. 6,429,725 B1, granted Aug. 6, 2002, which is a divisional of prior application Ser. No. 09/363,032, filed Jul. 29, 1999, now U.S. Pat. No. 6,278,316 B1, granted Aug. 21, 2001, which is based upon and claims the benefit of priority from the prior Japanese Patent Application No. 10-215635, filed Jul. 30, 1998, the entire contents of which are incorporated herein by reference.

BACKGROUND OF THE INVENTION

The present invention relates to a semiconductor device having a pump circuit and, more specifically, to a semiconductor device including a booster circuit for boosting a power supply voltage up to a predetermined one or a negative voltage generating circuit for stepping it down to a predetermined one.

A nonvolatile semiconductor memory device of an EEPROM requires a voltage which is higher than a power supply voltage when data is written to or erased from a memory cell. Such a semiconductor device includes a booster circuit for boosting up a power supply voltage to generate a high voltage. In a case where the device requires a negative voltage, a power supply voltage is stepped down to generate a given negative voltage.

FIG. 22 illustrates an arrangement of a prior art booster circuit disclosed in J. F. Dickson, IEEE Journal of Solid State Circuits, Vol. SC-11, pp. 374–8, Jun. 1976, and FIG. 23 shows an operating waveform of the circuit of FIG. 22. In this booster circuit, N-channel MOS transistors (referred to as NMOS transistors hereinafter) 17b, 17c and 17d are diode-connected in series between a terminal 17a to which a power supply voltage Vcc is applied and an output node OUT. An oscillator 17e is constituted of a NAND circuit and a plurality of inverter circuits, and an inverter circuit 17f and a capacitor 17g are connected in series between an output terminal of the oscillator 17e and a connection node N1 of the NMOS transistors 17b and 17c. Furthermore, inverter circuits 17h and 17i and a capacitor 17j are connected in series between the output terminal of the oscillator 17e and a connection node N2 of the NMOS transistors 17c and 17d.

In the above circuit arrangement, the oscillator 17e starts to oscillate when the level of a signal PMP supplied to one end of the NAND circuit of the oscillator 17e becomes high. The output signal of the oscillator 17e is supplied to both the connection node N1 through a series circuit of the inverter circuits 17f and capacitor 17g and the connection node N2 through a series circuit of the inverter circuits 17h and 17i and capacitor 17j. Thus, the connection nodes N1 and N2 sequentially increase in voltage and so does the output node OUT. As shown in FIG. 23, the output voltage becomes constant at voltage Vpp which strikes a balance between a current output from the booster circuit and a current consumed by a circuit (not shown) to which the output voltage is applied. To improve a voltage gain of the booster circuit, the threshold voltages of the NMOS transistors 17b, 17c and 17d are set low. Even though the threshold voltages become negative, the voltage gain can be improved if the period of a clock is sufficiently short. The NMOS transistors are therefore set at a threshold voltage of almost 0V.

The foregoing booster circuit temporarily stops operating when the signal PMP is at a low level. The potentials of the connection nodes N1 and N2 are then raised up to Vpp by a backflow of current from the output node OUT. If, then, the level of the signal PMP becomes high again to activate the booster circuit, the booster circuit operates out of a steady state for a while. The efficiency of the booster circuit or the ratio of output current to input current is considerably lowered, with the result that the booster circuit will be decreased in its operating stability. This problem depends upon the voltage amplitude of the capacitors and becomes more serious as the power supply voltage Vcc lowers. The prior art booster circuit is thus difficult to operate at a low voltage.

FIG. 24 illustrates another prior art booster circuit disclosed in J. C. Chen et al. 1996 Symposium on VLSI Circuits Digest of Technical Papers, pp. 172–3, Jun. 1996. The booster circuit comprises a P-channel MOS transistor (referred to as a PMOS transistor) 19b connected between a power supply terminal 19a to which a power supply voltage Vcc is applied and an output node OUT, a capacitor 19c one end of which is connected to the output node OUT, series-connected inverter circuits 19d and 19e for supplying a capacitor driving signal PMP to the other end of the capacitor 19c, and NMOS transistors 19f and 19g, PMOS transistors 19h and 19i and an inverter circuit 19j for controlling the PMOS transistor 19b in response to a signal ACT. The sources of the NMOS transistors 19f and 19g are grounded. The capacitor driving signal PMP is generated in response to the signal ACT.

FIG. 25 shows an operation of the booster circuit illustrated in FIG. 24. When the signal ACT is at a low level, the booster circuit is in a nonoperating state and the power supply voltage Vcc is output from the output node OUT via the PMOS transistor. If the signal ACT is set at a high level when the booster circuit starts to operate, the signal PMP at the power supply voltage Vcc is set at a high level in response to the signal ACT. Since the PMOS transistor 19b is then turned off, the output voltage is raised up to a voltage Vpp which depends upon a ratio of the capacity of a load (not shown) connected to the output node OUT and that of the capacitor 19c.

In the booster circuit for boosting an output voltage in the ratio of the capacity of the load to that of the capacitor, the output voltage depends upon the power supply voltage Vcc and the charging voltage of the capacitor 19c. For this reason, when the power supply voltage Vcc decreases, the output node OUT is difficult to increase up to the voltage Vpp only by the single capacitor 19c.

As described above, in the prior art booster circuit of FIG. 22 which is repeatedly activated and inactivated, the potentials of connection nodes N1 and N2 are increased by a backflow of current from the output terminal in the transition from the inactive state to the active state. For this reason, the prior art booster circuit has a problem of decreasing in efficiency especially when a power supply voltage is low.

In the booster circuit of FIG. 24 for boosting an output voltage in the ratio of the capacity of the load to that of the capacitor, a necessary booster voltage cannot be generated when a power supply voltage is low.

The same problems as above are true of a prior art negative voltage generating circuit.

BRIEF SUMMARY OF THE INVENTION

The present invention has been developed in order to resolve the foregoing problems and its object is to provide a semiconductor device having a pump circuit capable of generating a given output voltage even when a power supply voltage is decreased.

To attain the above object, a pump circuit according to a first aspect of the present invention comprises: a plurality of switching elements connected in series between a first node to which a first voltage is applied and an output node from which a second voltage other than the first voltage is output; at least one capacitor having a first terminal and a second terminal, the first terminal of the capacitor being connected to at least one connection node of the plurality of switching elements; a signal generator connected to the second terminal of the capacitor, for generating a driving signal when a control signal is first logic and stopping generation of the driving signal when the control signal is second logic; and a reset circuit connected to the connection node, for resetting a voltage of the connection node to a third voltage other than the second voltage when the control signal changes from the second logic to the first logic.

According to a second aspect of the present invention, there is provided a pump circuit comprising: a first capacitor having a first terminal and a second terminal, the first terminal being connected to an output node; a second capacitor having a third terminal and a fourth terminal, the third terminal being supplied with a first signal in an active mode; a first reset circuit connected to the second terminal of the first capacitor, for resetting the second terminal of the first capacitor to a first voltage in a standby mode; a second reset circuit connected to the fourth terminal of the second capacitor, for resetting the fourth terminal of the second capacitor to a second voltage other than the first voltage in the standby mode; and a switching element connected to the second terminal of the first capacitor and the fourth terminal of the second capacitor, for causing the first and second capacitors to be disconnected from each other in the standby mode and causing the first and second capacitors to be connected to each other in the active mode.

According to a third aspect of the present invention, there is provided a pump circuit comprising: a first booster circuit operated in response to an input signal of both first logic and second logic, the first booster circuit boosting a first voltage to generate a first boost voltage and output the first boost voltage from an output node; a second booster circuit whose output node is connected to the output node of the first booster circuit, the second booster circuit boosting the first voltage to generate a second boost voltage and output the second boost voltage from the output node when the input signal is first logic, and the second booster circuit stopping a boost operation when the input signal is second logic; and a reset circuit connected to at least one internal node of the second booster circuit, the internal node being supplied with the first boost voltage from the first booster circuit when the second booster circuit stops the boost operation, and the reset circuit resetting the internal node to a voltage which is lower than the first boost voltage when the input signal changes from the second logic to the first logic.

According to a fourth aspect of the present invention, there is provided a pump circuit comprising: a first capacitor having a first terminal and a second terminal, the first terminal of the first capacitor being connected to an output node; a second capacitor having a third terminal and a fourth terminal, the third terminal of the second capacitor being supplied with a first signal; a third capacitor having a fifth terminal and a sixth terminal and connected between the first and second capacitors; a first switching circuit connected between the output node and a terminal to which a first voltage is applied, the first switching circuit applying the first voltage to the output node when a second signal is first logic; a first reset circuit having a first node and a second node, for resetting a potential of each of the first and second nodes, the first node being connected to the second terminal of the first capacitor, and the second node being connected to the fifth terminal of the third capacitor; and a second reset circuit having a third node and a fourth node, for resetting a potential of each of the third and fourth nodes, the third node being connected to the sixth terminal of the third capacitor, and the fourth node being connected to the fourth terminal of the second capacitor, the first reset circuit including: a second switching circuit connected between the first and second nodes, for short-circuiting the first and second nodes when a third signal is second logic; a third switching circuit connected between the first node and a terminal to which a second voltage other than the first voltage is applied, the third switching circuit resetting a potential of the first node to the second voltage when a fourth signal is the first logic; and a fourth switching circuit connected between the second node and the terminal to which the first voltage is applied, the fourth switching circuit resetting a potential of the second node to the first voltage when the second signal is the first logic, and the second reset circuit including: a fifth switching circuit connected between the third and fourth nodes, for short-circuiting the third and fourth nodes when the third signal is the second logic; a sixth switching circuit connected between the third node and the terminal to which the second voltage is applied, the sixth switching circuit resetting a potential of the third node to the second voltage when the fourth signal is the first logic; and a seventh switching circuit connected between the fourth node and the terminal to which the first voltage is applied, the seventh switching circuit resetting a potential of the fourth node to the first voltage when the second signal is the first logic.

According to the pump circuit of the present invention, an input voltage is boosted up to generate a booster voltage and then output it from an output node when an input signal is first logic, and the boost operation is stopped when the input signal is second logic. A reset circuit resets at least one internal node to a voltage which is lower than the output voltage when the input signal changes from the second logic to the first logic. Since the internal node is reset to the lower voltage at the beginning of the operation, the pump circuit can start operating in a state close to the steady state. The pump circuit can thus be prevented from decreasing in boost efficiency when it starts to operate and thus the boost efficiency can be kept almost constant.

Since, moreover, a plurality of capacitors are connected in series in an active mode, a desired booster voltage can be generated easily even when a power supply voltage is lowered.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9 is a circuit diagram of a booster circuit according to a fourth embodiment of the present invention;

FIG. 10 is a circuit diagram illustrating an example of a voltage generation circuit;

FIG. 11 is a waveform chart showing an operation of the booster circuit of FIG. 9 and that of the voltage generation circuit of FIG. 10;

DETAILED DESCRIPTION OF THE INVENTION

Embodiments of the present invention will now be described with reference to the accompanying drawings.

Figure 2:
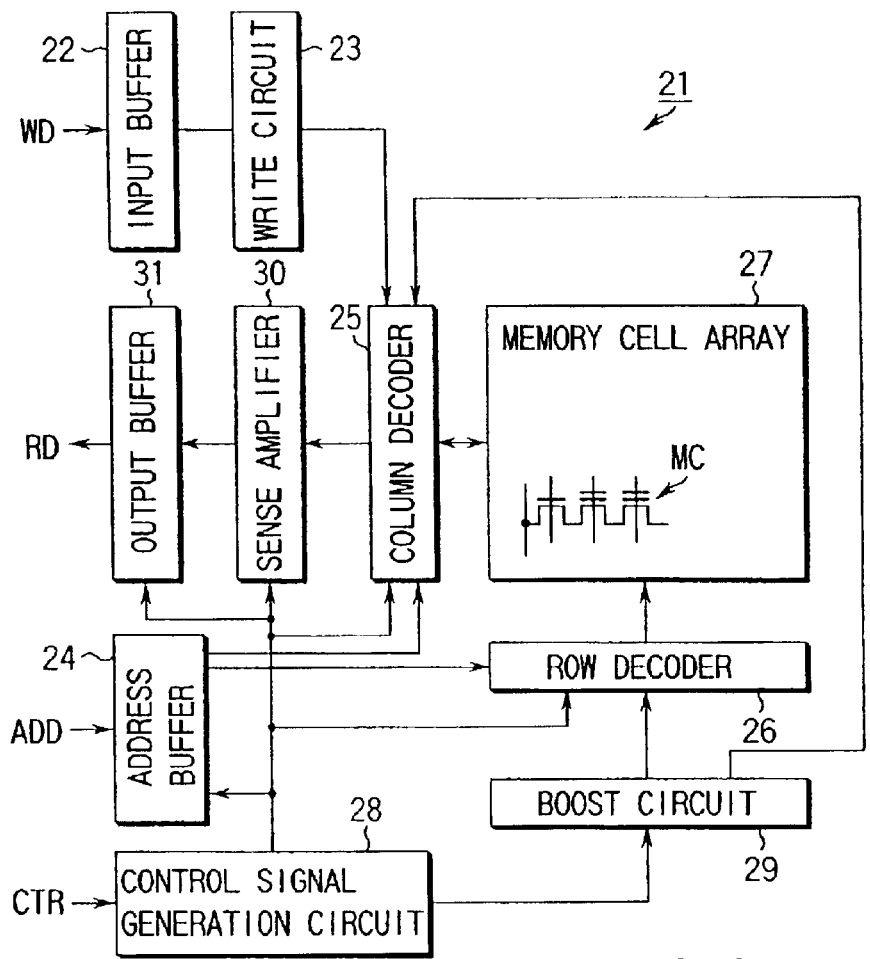
FIG. 2 is a block diagram showing an example of a semiconductor device to which the present invention is applied.

FIG. 2 illustrates a semiconductor device having a booster circuit of the present invention. Hereinafter the semiconductor device will be described taking a writable semiconductor memory device 21 having a booster circuit such as a flash EEPROM, as an example. The semiconductor memory device 21 receives write data WD, a control signal CTR and an address signal ADD from outside and writes the write data WD to a memory cell array 27 in response to the address signal ADD. The device 21 also reads data out of the memory cell array 27 in response to the control signal CTR and address signal ADD and outputs it as read data RD.

The write data WD is supplied to a write circuit 23 through an input buffer 22. The address signal ADD is supplied to a column decoder 25 and a row decoder 26 through an address buffer 24. The column decoder 25 and row decoder 26 select one MC of plural memory cells arranged in matrix in the memory cell array 27. A control signal generation circuit 28 controls a write voltage, write time, etc. and generates various timing signals. A booster circuit 29 boosts a power supply voltage in response to a control signal supplied from the control signal generation circuit 28, and generates a write voltage. The write voltage is then applied to the row decoder 26.

To read data out of the memory cell array 27, it is read out of a selected memory cell of the memory cell array 27 in response to an address signal and supplied to a sense amplifier 30 through the column decoder 25. The sense amplifier 30 amplifies a small signal from the memory cell to a logic voltage level. An output signal of the sense amplifier 30 is supplied outside from an output buffer 31 as read data RD.

Figure 1:
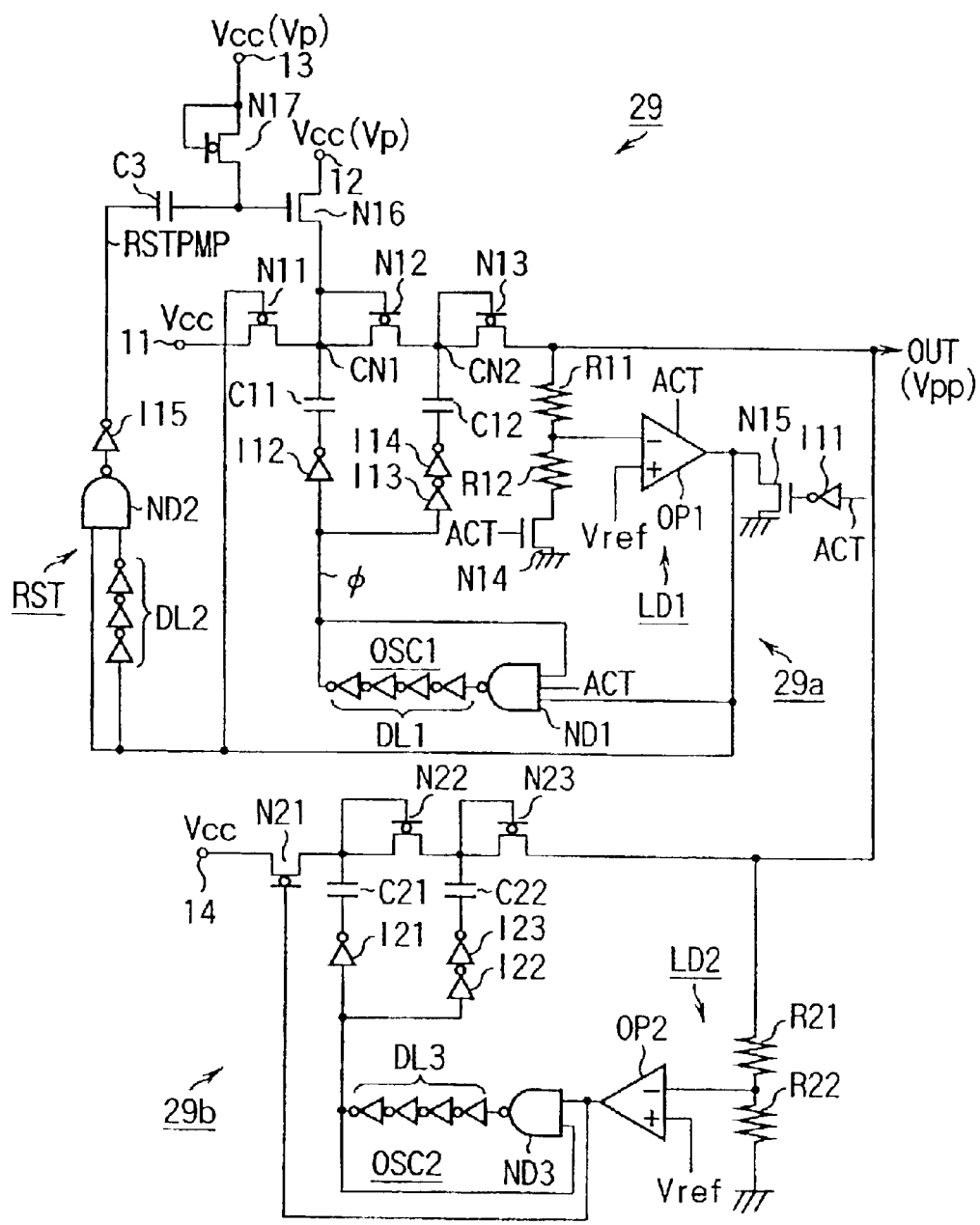
FIG. 1 is a circuit diagram of a booster circuit according to a first embodiment of the present invention.

FIG. 1 specifically shows an arrangement of the above booster circuit 29. The booster circuit 29 is constituted of an active-mode booster circuit 29a operating when the circuit 29 is active and a standby-mode booster circuit 29b operating when it is on standby. In the circuit 29a, NMOS transistors N11, N12 and N13 are connected in series between a power supply terminal 11 to which a power supply voltage Vcc is applied and an output node OUT. The NMOS transistors are each set at a low threshold voltage of almost zero. The NMOS transistor N12 operates as a diode since its gate and source are connected to each other, as does the NMOS transistor N13.

A level detector LD1 is connected to the output node OUT and constituted of resistors R11 and R12, an NMOS transistor N14 and an operational amplifier OP1. In other words, the resistors R11 and R12 and NMOS transistors N14 are connected in series between the output node OUT and the ground. The gate of the NMOS transistor N14 is supplied with an active signal ACT indicative of the circuit in an active mode. The resistors R11 and R12 detect a voltage of the output node OUT in the active mode. A connection node of the resistors R11 and R12 is connected to an inverted input terminal of the operational amplifier OP1 operating in response to the active signal ACT. A reference voltage Vref is applied to a non-inverted input terminal of the operational amplifier OP1. The output terminal of the amplifier OP1 is grounded through an NMOS transistor N15, and the gate of the NMOS transistor N15 is supplied with an active signal ACT through an inverter circuit I11.

The input terminal of an oscillator OSC1 is connected to the output terminal of the operational amplifier OP1. The oscillator OSC1 is constituted of a NAND circuit ND1 and a delay circuit DL1 including a plurality of inverter circuits connected in series, and the input terminal of the NAND circuit ND1 is supplied with an active signal ACT. The output terminal of the oscillator OSC1 is connected to a connection node CN1 of the NMOS transistors N11 and N12 through an inverter circuit I12 and a capacitor C11 and also connected to a connection node CN2 of the NMOS transistors N12 and N13 through inverter circuits I13 and I14 and a capacitor C12.

The output terminal of the operational amplifier OP1 is also connected to the gate of the NMOS transistor N11 and the input terminal of a reset signal generation circuit RST. The reset signal generation circuit RST includes a NAND circuit ND2, a delay circuit DL2 constituted of a plurality of series-connected inverter circuits, and an inverter circuit I15 connected to the output terminal of the NAND circuit ND2. A reset signal RSTPMP output from the output terminal of the reset signal generation circuit RST or that of the inverter circuit I15, is supplied to the gate of an NMOS transistor N16 via a capacitor C3. The drain of the NMOS transistor N16 is connected to a power supply terminal 12 to which a power supply voltage Vcc is applied, and the source thereof is connected to the connection node CN1 of the NMOS transistors N11 and N12. An NMOS transistor N17 is diode-connected between the gate of the NMOS transistor N16 and a power supply terminal 13 to which a power supply voltage Vcc is applied. The NMOS transistor N17 is set at a threshold voltage of almost zero. A voltage Vp, which is higher than the power supply voltage Vcc, can be applied to the power supply terminals 12 and 13. The voltage Vp is obtained by boosting the power supply voltage Vcc by another booster circuit (not shown).

In the standby-mode booster circuit 29b, NMOS transistors N21, N22 and N23 are connected in series between a power supply terminal 14 to which a power supply voltage Vcc is applied and an output node OUT. These NMOS transistors are each set at a low threshold voltage of almost zero. The NMOS transistors N22 operates as a diode since its gate and source are connected to each other, as does the NMOS transistor N23. A level detector LD2 is connected to the output node OUT. Resistors R21 and R22 are connected in series between the output node OUT and the ground. A connection node of the resistors R21 and R22 is connected to an inverted input terminal of an operational amplifier OP2. A reference voltage Vref is applied a non-inverted input terminal of the operational amplifier OP2.

The input terminal of an oscillator OSC2 is connected to the output terminal of the operational amplifier OP2. The oscillator OSC2 includes a NAND circuit ND3 and a delay circuit DL3 constituted of a plurality of inverter circuits connected in series. The output terminal of the oscillator OSC2 is connected to a connection node of the NMOS transistors N21 and N22 through an inverter circuit I21 and a capacitor C21 and also connected to a connection node of the NMOS transistors N22 and N23 through inverter circuits I22 and I23 and a capacitor C22. The output terminal of the operational amplifier OP2 is connected to the gate of the NMOS transistor N21.

Figure 3:
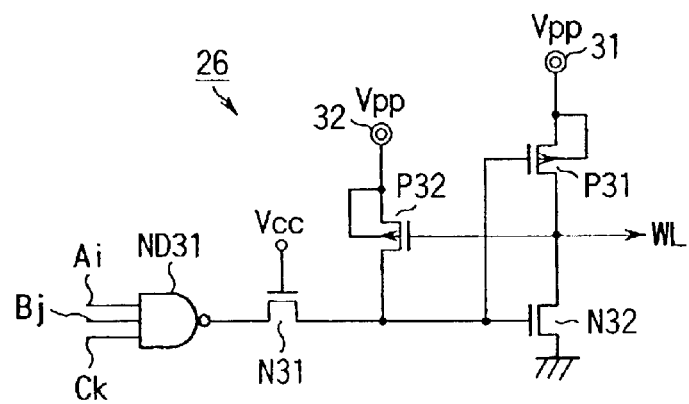
FIG. 3 is a circuit diagram showing an example of a row decoder of the semiconductor device of FIG. 2.

FIG. 3 specifically shows an arrangement of a word-line driving circuit included in the row decoder 26 described above. Signals Ai, Bj and Ck decoded in response to an address are supplied to the input terminal of a NAND circuit ND31. The output terminal of the NAND circuit ND31 is connected to one end of a current path of an NMOS transistor N31. A power supply voltage Vcc is applied to the gate of the NMOS transistor N31, and the other end of the current path is connected to the gate of a PMOS transistor P31 constituting an inverter circuit and that of an NMOS transistor N32. These PMOS and NMOS transistors P31 and N32 are connected between a power supply terminal 31 to which a booster voltage Vpp is applied from the booster circuit 29 and the ground. A connection node of the transistors P31 and N32 is connected to a word line WL. Furthermore, a PMOS transistor P32 is connected between a power supply terminal 32 to which a booster voltage Vpp is applied and the gate of the NMOS transistor N32. The gate of the PMOS transistor P32 is connected to a connection node of the PMOS and NMOS transistors P31 and N32.

The operations of the above circuits shown in FIGS. 1 and 3 will now be described with reference to FIG. 4.

The resistors R21 and R22, operational amplifier OP2 and oscillator OSC2, which constitute the level detector LD2 of the standby-mode booster circuit 29b, continue to operate constantly in both a standby mode and an active mode. For this reason, the capacitors C21 and C22 are sequentially increased in voltage in response to the output signal of the oscillator OSC2, and a booster voltage Vpp which is higher than the power supply voltage Vcc is applied to the output node OUT through the NMOS transistors N22 and N23. In the standby mode, the booster voltage Vpp is applied to the output node OUT from the standby-mode booster circuit 29b.

In the standby mode, the active signal ACT is at a low level and thus the active-mode booster circuit 29a stops. Since, however, the booster voltage Vpp is applied to the output node OUT from the circuit 29b, the connection node CN1 is set at the booster voltage Vpp through the NMOS transistors N12 and N13 having a low threshold voltage.

Figure 4:
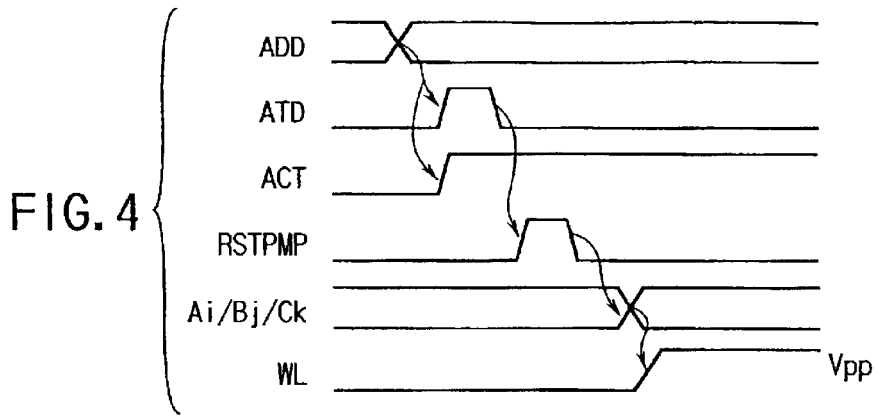
FIG. 4 is a chart showing an operation of the booster circuit of FIG. 1 and that of the row decoder of FIG. 3.

If the address signal ADD is then switched in a data read mode, address switching is detected by an address transition detection, circuit (not shown), and a pulse signal ATD is output from this circuit as shown in FIG. 4. When the active signal ACT is set at a high level in response to the pulse signal ATD, the reset signal generation circuit RST is operated by means of the inverter circuit I11 and NMOS transistor N15 to generate a reset signal RSTPMP. This reset signal is supplied to the gate of the NMOS transistor N16 through the capacitor C3. Thus, the NMOS transistor N16 turns on, and the connection node CN1 of the NMOS transistors N11 and N12 is reset to the power supply voltage Vcc from the booster voltage Vpp.

When the active signal ACT is set at a high level, the oscillator OSC1 is activated and oscillated. The output signals of the oscillator OSC1 are supplied in sequence to the capacitors C11 and C12 via the inverter circuits I12, I13 and I14, and the voltages of the connection nodes CN1 and CN2 are increased in order through the capacitors C11 and C12. Therefore, a booster voltage Vpp which is higher than the power supply voltage is output from the output node OUT. The booster voltage Vpp is detected by the resistors R11 and R12 and compared with a reference voltage Vref in the operational amplifier OP1. In accordance with the comparison result, the operation of the oscillator OSC1 is controlled and the booster voltage Vpp is retained.

If the decoded signals Ai, Bj and Ck input to the row decoder 26 in response to an address are set at a high level after the active signal ACT is set at a high level, the booster voltage Vpp is applied to a selected word line WL.

According to the first embodiment described above, if an address is switched to set the active signal ACT at a high level, a reset signal RSTPMP is generated from the reset signal generation circuit RST and the connection node CN1 is reset at the power supply voltage Vcc through the NMOS transistor N16. The operation of the booster circuit can thus be started in a state close to the steady state of the active-mode booster circuit 29a. Consequently, the circuit can be prevented from decreasing in boost efficiency when it starts to operate and thus the boost efficiency can be kept almost constant.

In the above first embodiment, the connection node CN1 is reset. The present invention is not limited to this. Both the connection nodes CN1 and CN2 can be reset.

Figure 5:
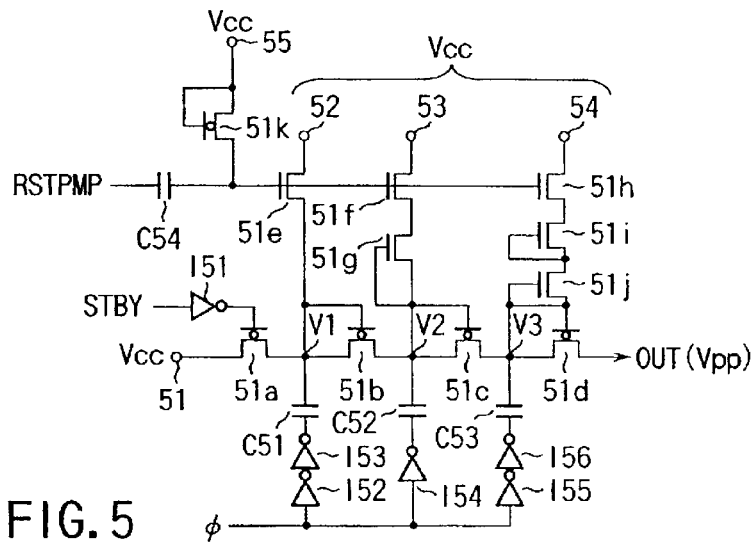
FIG. 5 is a circuit diagram of a booster circuit according to a second embodiment of the present invention.
Figure 6:
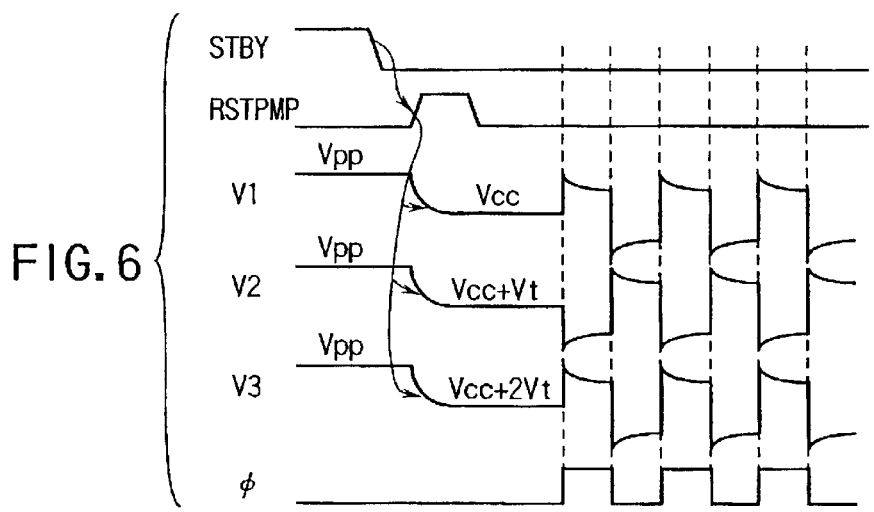
FIG. 6 is a waveform chart showing an operation of the booster circuit of FIG. 5.

FIGS. 5 and 6 illustrate an arrangement of a booster circuit according to a second embodiment of the present invention which differs from that of the booster circuit of the first embodiment. In the booster circuit of the second embodiment, a plurality of internal nodes can be reset independently of one another.

NMOS transistors 51a, 51b, 51c and 51d are connected in series between a power supply terminal 51 to which a power supply voltage Vcc is applied and an output node OUT. A standby signal STBY is supplied to the gate of the NMOS transistor 51a via an inverter circuit I51. Each of the NMOS transistors 51b, 51c and 51d serves as a diode since its gate is connected to one end of a current path. A clock signal φ is supplied to a connection node V1 of the NMOS transistors 51a and 51b through inverter circuits I52 and I53 and a capacitor C51, a connection node V2 of the NMOS transistors 51b and 51c through an inverter circuit I54 and a capacitor C52, and a connection node V3 of the NMOS transistors 51c and 51d through inverter circuits I55 and I56 and a capacitor C53.

Moreover, an NMOS transistor 51e is connected between a power supply terminal 52 to which a power supply voltage Vcc is applied and the connection node V1 of the NMOS transistors 51a and 51b. NMOS transistors 51f and 51g are connected in series between a power supply terminal 53 to which a power supply voltage Vcc is applied and the connection node V2 of the NMOS transistors 51b and 51c. The gate of the transistor 51g is connected to the connection node V2. Furthermore, NMOS transistors 51h, 51i and 51j are connected in series between a power supply terminal 54 to which a power supply voltage Vcc is applied and the gate of the NMOS transistor 51d. The gate of the NMOS transistor 51i is connected to a connection node of the NMOS transistors 51i and 51j, and the gate of the NMOS transistor 51j is connected to the connection node V3 of the NMOS transistors 51c and 51d. A reset signal RSTPMP is supplied to the gates of the NMOS transistors 51e, 51f and 51h through a capacitor C54. An NMOS transistor 51k is connected between a power supply terminal 55 to which a power supply voltage Vcc is applied and the gate of the NMOS transistor 51e. The NMOS transistor 51k is set at a low threshold voltage and connected to a power supply terminal 55.

The foregoing signal φ is generated from the control signal generation circuit 28 illustrated in FIG. 2.

The operation of the above booster circuit shown in FIG. 5 will now be described with reference to FIG. 6. The standby signal STBY is set at a high level in the standby mode. Since the standby signal is supplied to the gate of the NMOS transistor 51a via the inverter circuit I51, the NMOS transistor 51a is turned off in the standby mode.

When the standby mode is released, the level of the standby signal STBY becomes low. The NMOS transistor 51a thus turns on. A reset signal RSTPMP is generated as the level of the standby signal STBY becomes low. The NMOS transistors 51e, 51f and 51h are turned on in response to the reset signal RSTPMP, and the connection nodes V1, V2 and V3 of the NMOS transistors 51a to 51d are reset to their respective power supply voltages Vcc, Vcc+Vt, and Vcc+2Vt, where Vt indicates a threshold voltage of each of the NMOS transistors 51g, 51i and 51j. After that, a boost operation is started in response to a clock signal φ and a booster voltage Vpp is output from the output node OUT.

According to the second embodiment, when the standby mode is released, the connection nodes V1, V2 and V3 of diode-connected NMOS transistors 51b to 51d are reset to different voltages corresponding to their booster voltages in response to a reset signal RSTPMP. Since, therefore, the booster circuit can be operated in a state close to the steady state when it starts to operate, the boost efficiency can always be kept almost constant.

Figure 7:
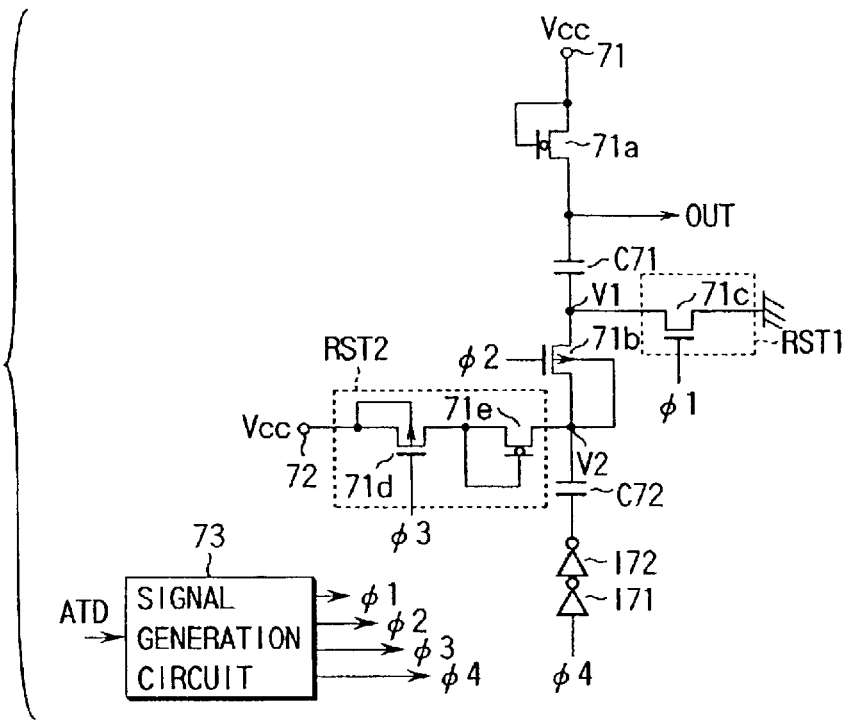
FIG. 7 is a circuit diagram of a booster circuit according to a third embodiment of the present invention.
Figure 8:
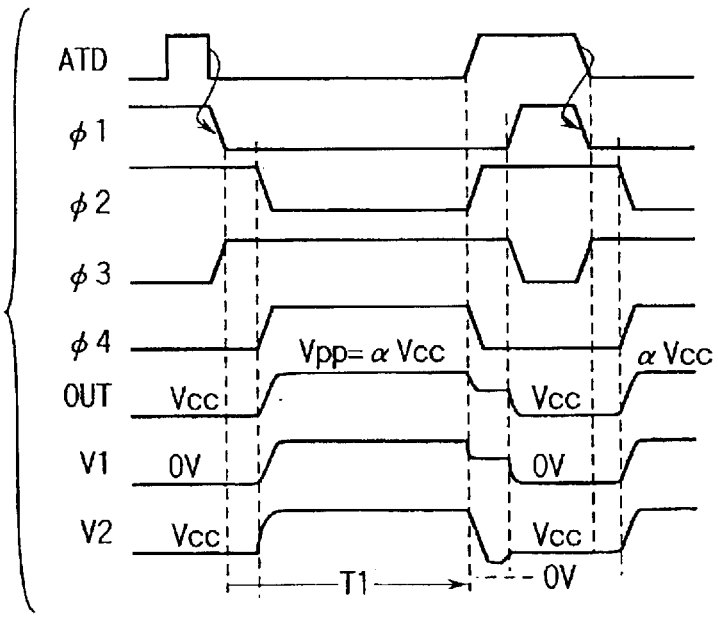
FIG. 8 is a waveform chart showing an operation of the booster circuit of FIG. 7.

FIGS. 7 and 8 illustrate an arrangement of a booster circuit according to a third embodiment of the present invention.

An NMOS transistor 71a is connected between an output node OUT and a power supply terminal 71 to which a power supply voltage Vcc is applied. The gate of the NMOS transistor 71a is connected to the power supply terminal 71, and the NMOS transistor 71a functions as a diode. Inverter circuits I71 and I72, a capacitor C72, a PMOS transistor 71b, and a capacitor C71 are connected in series between the input terminal of a signal φ4 and the output node OUT. The gate of the PMOS transistor 71b is supplied with a signal φ2. An NMOS transistor 71c is connected between a connection node V1 of the PMOS transistor 71b and capacitor C71 and the ground. The gate of the NMOS transistor is supplied with a capacitor reset signal φ1. A PMOS transistor 71d and an NMOS transistor 71e are connected in series between a power supply terminal 72 to which a power supply voltage Vcc is applied and a connection node V2 of the capacitor C72 and PMOS transistor 71b. The gate of the PMOS transistor 71d is supplied with a capacitor reset signal φ3. The gate of the NMOS transistor 71e is connected to the drain thereof, and the NMOS transistor 71e operates as a diode. The NMOS transistors 71a and 71e are each set at a low threshold voltage. The NMOS transistor 71c constitutes a first reset circuit RST1, while the PMOS and NMOS transistors 71d and 71e constitute a second reset circuit RST2. The signals φ1 to φ4 are generated from a signal generation circuit 73 in response to a pulse signal ATD. The pulse signal ATD is output when an address transition detection circuit (not shown) detects a transition of an address signal.

The operation of the booster circuit having the above arrangement will be described. Since, as shown in FIG. 8, the capacitor reset signals φ1 and φ2 are set at a high level in the standby mode, the NMOS transistor 71c is turned on, the PMOS transistor 71b is turned off, and the connection node V1 is reset at a potential of 0V. A power supply voltage Vcc is therefore output from the output node OUT via the NMOS transistor 71a. The signal φ3 is set at a low level in the standby mode, the PMOS transistor 71d is turned on, and the signal φ4 is set at a low level. Consequently, the potential of the connection node V2 is changed to the power supply voltage Vcc through the PMOS and NMOS transistors 71d and 71e.

If, in the above status, the address transition detection circuit detects a transition of an address signal, a pulse signal ATD is output as illustrated in FIG. 8. When the pulse signal ATD is input, the level of the capacitor reset signal φ1 becomes low and that of the capacitor reset signal φ3 becomes high, and both the NMOS and PMOS transistors 71c and 71d are turned off. After that, the signal φ2 is set at a low level, the PMOS transistor 71b are turned on, and the two capacitors C71 and C72 are connected in series. At the same time, the signal φ4 becomes high in level and thus the voltage of the output node OUT is increased to the booster voltage Vpp. If the two capacitors C71 and C72 are connected in series, a constant α indicative of a voltage gain can be set to 2 or more, with the result that a booster voltage Vpp can be generated instantaneously even when a power supply voltage is low.

In the above-described booster circuit, when a pulse signal ATD is generated again, the level of the signal φ2 becomes high and that of the signal φ4 becomes low at the rising edge of the pulse signal ATD. For this reason, the PMOS transistor 71b turns off to disconnect the capacitors C71 and C72 from each other, and the potentials of the connection node V1 and output node OUT slightly decrease. Moreover, the potential of the connection node V2 decreases to a potential of not higher than the power supply voltage Vcc and not lower than 0V. When the capacitor reset signal φ1 set at a high level and the signal φ3 is set at a low level, the potential of the connection node V1 is reset at 0V through the transistor 71c and accordingly the potential of the output node OUT is changed to the power supply voltage Vcc. The connection node V2 is then charged to the power supply voltage Vcc through the transistors 71d and 71e.

According to the foregoing third embodiment, the two capacitors C71 and C72 can be connected in series with the transistor 71b therebetween. Therefore, even when a power supply voltage is low, it can be boosted up to a considerably high voltage.

The above booster circuit is so arranged that the connection nodes V1 and V2 of the capacitors C71 and C72 are reset at the rising edge of a pulse signal ATD and they are increased in voltage at the falling edge thereof. For this reason, the booster circuit can stably be operated even though its operation and non-operation are repeated at irregular intervals.

When the connection nodes are reset, the transistor 71b is turned off and then the transistor 71c is turned on. The connection node V2 is thus set at a potential of not higher than the power supply voltage Vcc and not lower than 0V and then charged to the power supply voltage Vcc. Since, therefore, the connection node V2 is not discharged to 0V, it can be charged to the power supply voltage Vcc with low current consumption.

FIG. 9 illustrates a booster circuit according to a fourth embodiment of the present invention. This booster circuit is a modification to that of the third embodiment, and includes three capacitors C91, C92 and C93 connected in series. An NMOS transistor 91a of a depletion type is connected between an output node OUT and a power supply terminal 91 to which a power supply voltage Vcc is applied. The gate of the NMOS transistor 91a is supplied with a signal φ3. Inverter circuits I91 and I92, a capacitor C93, a PMOS transistor 91c, a capacitor C92, a PMOS transistor 91b and a capacitor C91 are connected in series between the input terminal of a signal φ4 and the output node OUT. The gates of the PMOS transistors 91b and 91c are supplied with a voltage V5 having the same level as that of a booster voltage Vpp. The booster voltage Vpp is applied to the substrate of the PMOS transistors 91b and 91c.

An NMOS transistor 91d is connected between a connection node V1 of the PMOS transistor 91b and capacitor C91 and the ground. An NMOS transistor 91e is connected between a connection node V3 of the PMOS transistor 91c and capacitor C92 and the ground. The gates of the NMOS transistors 91d and 91e are supplied with a capacitor reset signal φ1.

A depletion type NMOS transistor 91f is connected between a connection node V2 of the capacitor C92 and PMOS transistor 91b and a power supply terminal 92 to which a power supply voltage Vcc is applied. A depletion type NMOS transistor 91g is connected between a connection node V4 of the capacitor C93 and PMOS transistor 91c and a power supply terminal 93 to which a power supply voltage Vcc is applied. The gates of the NMOS transistors 91f and 91g are supplied with a signal φ3.

FIG. 10 shows an example of a voltage generation circuit 100 for generating the above-described voltage V5. The voltage generation circuit 100 is a so-called level conversion circuit. In this circuit, a PMOS transistor 103 and an NMOS transistor 104 are connected in series between the ground and a power supply terminal 101 to which a booster voltage Vpp is applied, and a PMOS transistor 105 and an NMOS transistor 106 are connected in series between the ground and a power supply terminal 102 to which a booster voltage Vpp is applied. The gate of the NMOS transistor 104 is supplied with a signal φ2 just set at Vcc, and the gate of the NMOS transistor 106 is supplied with the signal φ2 through an inverter circuit 107. A connection node of the PMOS and NMOS transistors 103 and 104 is connected to the gate of the PMOS transistor 105. A connection node of the PMOS and NMOS transistors 105 and 106 is connected to the gate of the PMOS transistor 103, and a voltage V5 of a Vpp level is output from the connection node.

The operation of the voltage generation circuit 100 having the above arrangement will be described with reference to FIG. 11. In the standby mode, the levels of capacitor reset signals φ1 and φ3 and signal φ2 are high and that of a signal φ4 is low. Since the signal φ2 is at a high level, the voltage generation circuit 100 outputs a voltage V5. The NMOS transistors 91d, 91e, 91f and 91g are turned on, and the PMOS transistors 91b and 91c are turned off. The connection nodes V1 and V3 are grounded, and the connection nodes V2 and V4 are charged to the power supply voltage Vcc. The output node OUT is also set at the power supply voltage Vcc through the NMOS transistor 91a.

If, in this state, a pulse signal ATD is output, the capacitor reset signals φ1 and φ3 and signal φ2 are sequentially set at a low level as the pulse signal ATD falls. The NMOS transistors 91a, 91d, 91e, 91f and 91g are turned off, the PMOS transistors 91b and 91c are turned on, the capacitors C91, C92 and C93 are connected, and the output node OUT is boosted in accordance with the signal φ4. This booster voltage is three or more times as high as the power supply voltage Vcc.

When a pulse signal ATD is generated again, the connection nodes V1 to V4 are reset at the foregoing potential in accordance with the rise of the pulse signal ATD and then the above booster operation is performed in accordance with the fall of the pulse signal ATD.

According to the above fourth embodiment, a voltage three or more times higher than the power supply voltage Vcc can be generated; therefore, a reliable operation can be achieved even when the power supply voltage is much lower.

A fifth embodiment of the present invention will now be described. The semiconductor device as shown in FIG. 1 includes both a standby-mode booster circuit and an active-mode booster circuit. The standby-mode booster circuit generates a booster voltage in the standby mode, and a booster voltage of the active-mode booster circuit is used when the standby mode is changed to the active mode. In this semiconductor device, the booster voltages in both the standby and active modes are set at the same level. However, a difference in booster voltage between these modes is likely to be caused due to variations in elements. If the level of the booster voltage in the standby mode is set higher than that in the active mode, it is likely that the standby-mode booster circuit will operate so as to compensate for the voltage difference and the current will be consumed transitionally though the active mode is switched to the standby mode. This transitional current is averaged by standby time, but the standby current is increased.

In the fifth embodiment, therefore, the standby current is prevented from increasing by setting a booster voltage generated in the standby mode lower than that generated in the active mode.

Figure 12:
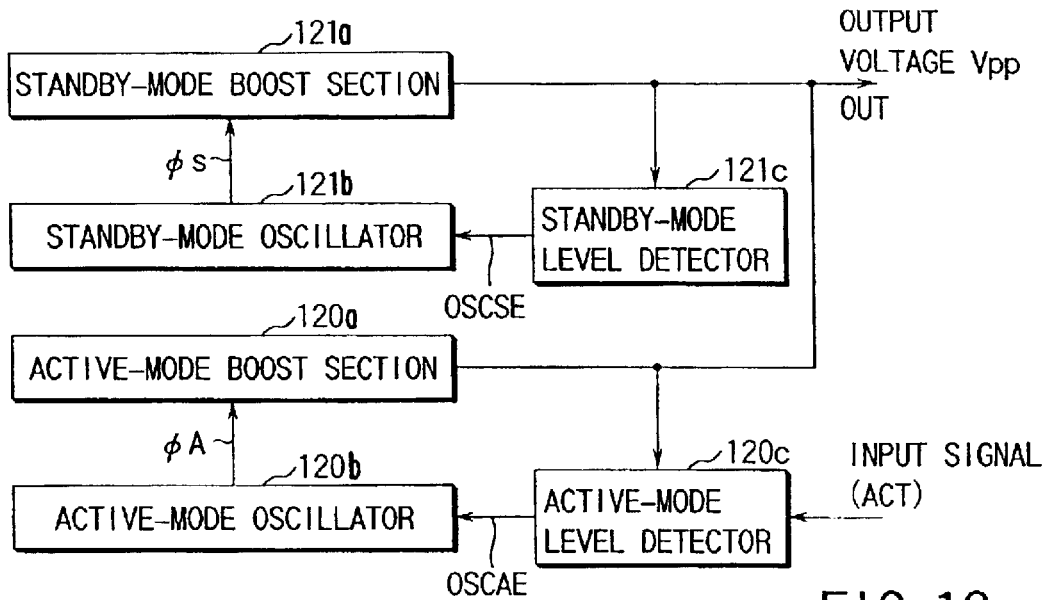
FIG. 12 is a circuit diagram of a booster circuit according to a fifth embodiment of the present invention.

As illustrated in FIG. 12, an active-mode booster section 120a performs a boost operation in response to an output signal φA of an active-mode oscillator 120b to generate a booster voltage VppA from an output node OUT. A booster voltage output from the active-mode booster section 120a is detected by an active-mode level detector 120c. The detector 120c is operated in response to an active signal as an input signal. An oscillating operation of the active-mode oscillator 120b is controlled in response to an output signal OSCAE detected by the active-mode level detector 120c. The active-mode booster section 120a, active-mode oscillator 120b and active-mode level detector 120c correspond to the active-mode booster circuit 29a shown in FIG. 1.

A standby-mode booster section 121a performs a boost operation in response to an output signal φS of a standby-mode oscillator 121b to generate a booster voltage VppS from the output node OUT. This booster voltage VppS is set lower than the booster voltage VppA in the active mode. A booster voltage output from the standby-mode booster section 121a is detected by a standby-mode level detector 121c. An oscillating operation of the standby-mode oscillator 121b is controlled in response to an output signal OSCSE detected by the standby-mode level detector 121c. The standby-mode booster section 121a, standby-mode oscillator 121b and standby-mode level detector 121c correspond to the standby-mode booster circuit 29b shown in FIG. 1.

In the circuit shown in FIG. 1, however, the divided resistance ratio of the resistors R11 and R12 constituting the level detector of the active-mode booster circuit 29a and that of the resistors R21 and R22 constituting the level detector of the standby-mode booster circuit 29b are the same. In contrast, according to the fifth embodiment, the divided resistance ratio of the active-mode level detector 120c and that of the standby-mode level detector 121c are different from each other, as will be described later. The booster voltage VppS in the standby mode is therefore set lower than the booster voltage VppA in the active mode.

Figure 13:
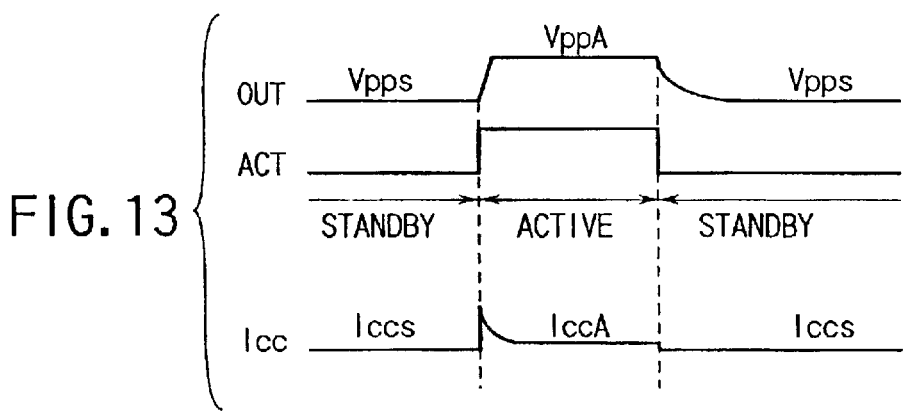
FIG. 13 is a waveform chart showing an operation of the booster circuit of FIG. 12.

The operation of the booster circuit having the above arrangement will be described with reference to FIG. 13. When an input signal ACT is at a high level, the active-mode oscillator 120b operates and the active-mode booster section 120a operates to generate a booster voltage. If the active-mode level detector 120c operates and the booster voltage output from the output node OUT reaches VppA, the boost operation stops. Since the booster voltage VppS in the standby mode is set lower than the booster voltage VppS in the active mode, current consumption Icc increases in the transition from the standby mode to the active mode. If, however, the booster voltage reaches VppA, the current consumption becomes equal to normal active consumption IccA.

When the level of the input signal ACT becomes low, the active-mode level detector 120c is inactivated and consumes no current. The level of a signal OSCAE for activating the active-mode oscillator 120b therefore becomes low and the oscillator 120b is also inactivated. In the standby mode, therefore, the active-mode circuit consumes no current. The standby-mode circuit, which continues to operate from the active mode, consumes a small amount of current IccS and thus the current consumption is remarkably decreased. If the booster voltage is lowered by a leak current from the output node OUT and arrived at Vpps which is lower than VppA in the active mode, this is detected by the standby-mode level detector 121c, and both the standby-mode oscillator and booster section 121b and 121a are operated.

Figure 14A:
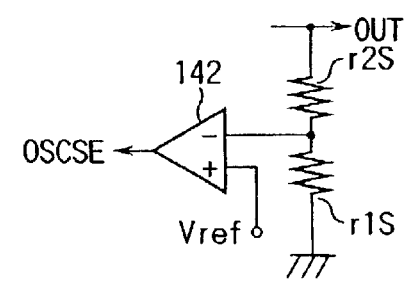
FIG. 14A is a circuit diagram illustrating an arrangement of a standby-mode level detector.
Figure 14B:
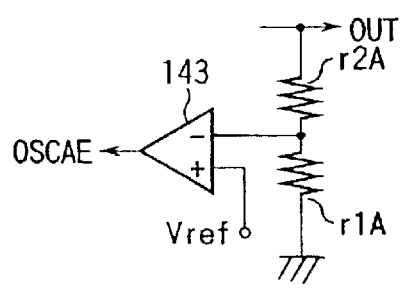
FIG. 14B is a circuit diagram illustrating an arrangement of an active-mode level detector.

FIG. 14A illustrates the arrangement of the standby-mode level detector 121c and FIG. 14B shows that of the active-mode level detector 120c. As illustrated in FIG. 14A, resistors r1S and r2S are connected in series between the ground and the output node OUT from which a booster voltage is output. A connection node of these resistors is connected to an inverted input terminal of an operational amplifier 142. A reference voltage Vref is applied to a non-inverted input terminal of the operational amplifier 142, and a signal OSCSE is output from the output terminal.

As shown in FIG. 14B, resistors r1A and r2A are connected in series between the ground and the output node OUT from which a booster voltage is output. A connection node of these resistors is connected to an inverted input terminal of an operational amplifier 143. A reference voltage Vref is applied to a non-inverted input terminal of the operational amplifier 143 and a signal OSCAE is output from the output terminal.

The divided resistance ratio (r1S+r2S)/r1S of the resistors r1S and r2S shown in FIG. 14A is set smaller than that (r1A+r2A)/r1A of the resistors r1A and r2A shown in FIG. 14B. A relationship between the booster voltages VppA and VppS can thus be set to VppS<VppA. Since possible element variations are taken into consideration in the difference in voltage, the relationship between the two booster voltages remains unchanged even when the variations occur.

Figure 15A:
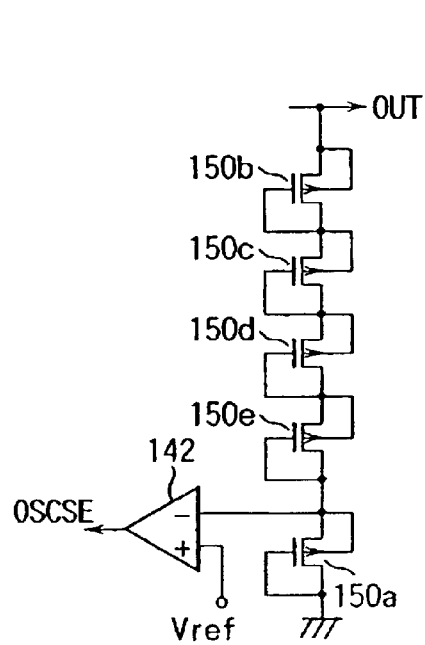
FIG. 15A is a circuit diagram showing a modification of the standby-mode level detector of FIG. 14A.

In the level detector shown in FIG. 15A, the resistors r1S and r2S shown in FIG. 14A are constituted of a PMOS transistor 150a and a set of PMOS transistors 150b to 150e, respectively. In the level detector shown in FIG. 15B, the resistors r1A and r2A shown in FIG. 14B are constituted of a PMOS transistor 151a and a set of PMOS transistors 151b to 151f, respectively. In this constitution, too, a relationship between booster voltages VppA and VppS can be set to VppS<VppA.

Figure 15B:
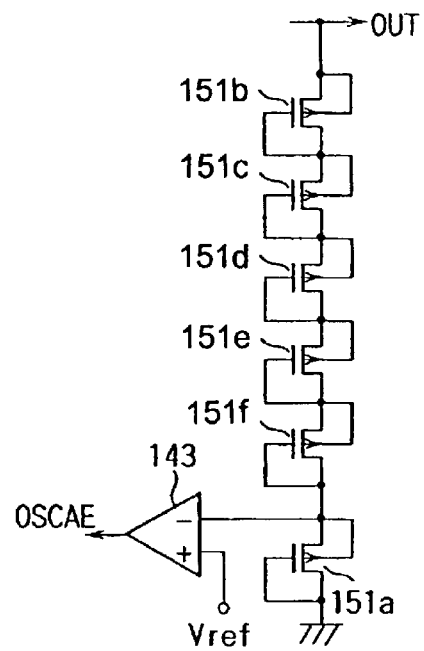
FIG. 15B is a circuit diagram showing a modification of the active-mode level detector of FIG. 14B.
Figure 16A:
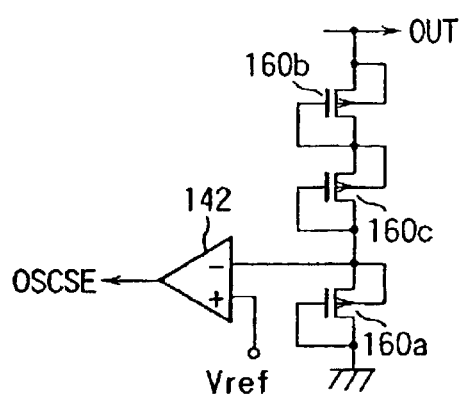
FIG. 16A is a circuit diagram showing another modification of the standby-mode level detector of FIG. 14A.
Figure 16B:
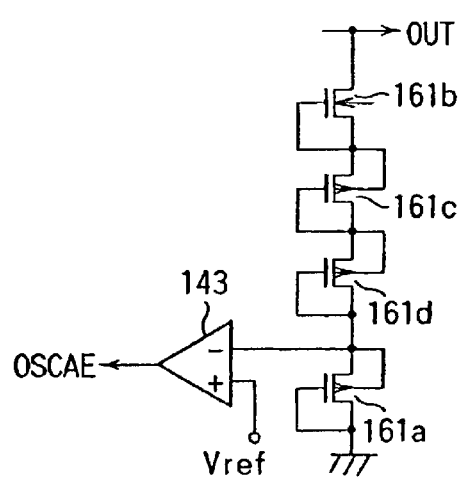
FIG. 16B is a circuit diagram showing another modification of the active-mode level detector of FIG. 14B.

FIGS. 16A and 16B illustrate modifications to the standby-mode level detectors shown in FIGS. 15A and 15B, respectively. In these modifications, the number of transistors is different and so is the conductivity type. More specifically, in FIG. 16A, the resistors r1S and r2S shown in FIG. 14A are constituted of a PMOS transistor 160a and a set of PMOS transistors 160b and 160c, respectively. In FIG. 16B, the resistors r1A and r2A shown in FIG. 14B are constituted of a PMOS transistor 161a and a set of NMOS transistor 161b and PMOS transistors 161c and 161d, respectively. In this constitution, too, a relationship between booster voltages VppA and VppS can be set to VppS<VppA.

Figure 17:
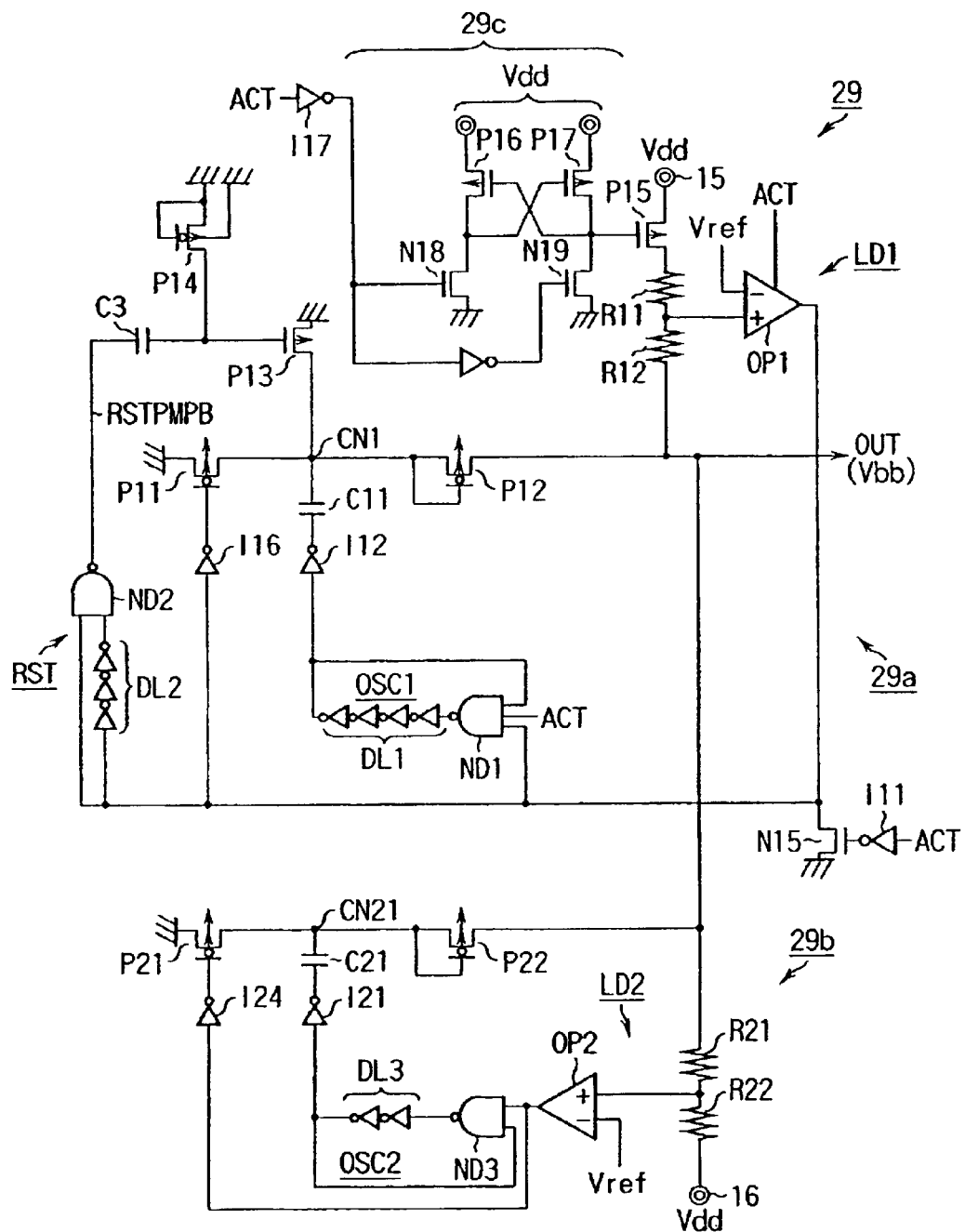
FIG. 17 is a circuit diagram of a negative voltage generating circuit according to a sixth embodiment of the present invention.

FIG. 17 shows a pump circuit for generating a negative voltage or a negative voltage generating circuit according to a sixth embodiment of the present invention. Since the circuit of FIG. 17 is a modification to that of FIG. 1, the same constituting elements as those of FIG. 1 are denoted by the same reference numerals and only different elements will be described.

In an active-mode negative voltage generating circuit 29a, PMOS transistors P11 and P12 are connected in series between an output node OUT and a ground terminal. The gate of the transistor P11 is connected to the output terminal of an operational amplifier OP1 constituting a level detector LD1, through an inverter circuit I16. The gate of the transistor P12 is connected to a connection node CN1 of the transistors P11 and P12. The output terminal of an oscillator OSC1 is connected to the connection node CN1 via a capacitor C11 and an inverter circuit I12. The output terminal of a reset signal generation circuit RTS is connected to the gate of a PMOS transistor P13 via a capacitor C3. One end of a current path of the transistor P13 is grounded and the other end thereof is connected to the connection node CN1. Moreover, one end of a current path of a PMOS transistor P14 is connected to the gate of the PMOS transistor P13. The other end of the current path of the transistor P14 is grounded, as are the gate and substrate thereof.

In the level detector LDI, one end of a current path of a PMOS transistor P15 is connected to a terminal 15 to which a voltage Vdd is applied. The voltage Vdd does not depend upon a power supply voltage Vcc and is lower than Vcc. An active signal ACT is supplied to the gate of the PMOS transistor P15 through an inverter circuit 117 and a level conversion circuit 29c. The other end of the current path of the PMOS transistor P15 is connected to the output node OUT via resistors R11 and R12. A connection node of the resistors R11 and R12 is connected to a non-inverted input terminal of the operational amplifier OP1, and a reference voltage Vref is applied to an inverted input terminal thereof. The level conversion circuit 29c includes two NMOS transistors N18 and N19 and two PMOS transistors P16 and P17. The gate of NMOS transistor N18 receives the inverted ACT signal output from inverter I17 and the gate of NMOS transistor N19 receives the inverted ACT signal output from inverter I17 through another inverter. One end of the current paths of NMOS transistors N18 and N19 is connected to ground. The other end of the current path of NMOS transistor N18 is connected to one end of the current path of the PMOS transistor P16 and the gate of the PMOS transistor P17. The other end of the current path of the NMOS transistor N19 is connected to one end of the current path of PMOS transistor P17 and the gate of PMOS transistor P16. The other ends of the current path of PMOS transistors P16 and P17 are connected to a terminal to which a voltage Vdd is applied.

In a standby-mode negative voltage generating circuit 29b, PMOS transistors P21 and P22 are connected in series between the output node OUT and a ground terminal. The gate of the transistor P21 is connected to the output terminal of an operational amplifier OP2 constituting a level detector LD2, through an inverter circuit I24. The gate of the transistor P22 is connected to a connection node CN21 of the transistors P21 and P22. The output terminal of an oscillator OSC2 is connected to the connection node CN21 via a capacitor C21 and an inverter circuit I21. In the level detector LD2, resistors R21 and R22 are connected in series between the output node OUT and a power supply terminal 16 to which a voltage Vdd is applied. A connection node of the resistors R21 and R22 is connected to a non-inverted input terminal of the operational amplifier OP2, and a reference voltage Vref is applied to an inverted input terminal thereof. The PMOS transistors P11, P12, P14, P21 and P22 are each set at a threshold voltage of 0V.

The operation of the circuit shown in FIG. 17 is basically the same as that of the circuit shown in FIG. 1. The standby-mode negative voltage generating circuit 29b continues to operate in both the standby and active modes. Therefore, the capacitor C21 is decreased in voltage in response to an output signal of the oscillator OSC2, and a voltage Vbb, which is lower than the power supply voltage Vcc, is output from the output terminal through the PMOS transistor P22.

If an address signal ADD is switched in a data read mode, this address switching is detected by an address transition detection circuit (not shown), and a pulse signal ATD is output from this circuit as shown in FIG. 4. When the level of the active signal ACT becomes high in response to the pulse signal ATD, the reset signal generation circuit RST is operated by means of the inverter circuit I11 and NMOS transistor N15 to generate a reset signal RSTPMPB. This reset signal is supplied to the gate of the PMOS transistor P13 through the capacitor C3. Thus, the PMOS transistor P13 turns on, and the connection node CN1 of the PMOS transistors P11 and P12 is reset to the ground potential from the negative voltage Vbb. The connection node CN1 is decreased in voltage through the capacitor C11 in accordance with the operation of the oscillator OSC1. The negative voltage Vbb, which is lower than the power supply voltage, is therefore output from the output node OUT. The voltage Vbb is detected by the resistors R11 and R12 and compared with a reference voltage Vref in the operational amplifier OP1. In accordance with the comparison result, the operation of the oscillator OSC1 is controlled and the negative voltage Vbb is retained.

In the foregoing sixth embodiment, the negative voltage Vbb can be generated. When the standby mode is changed to the active mode, the connection node CN1 is reset to the ground potential by the reset circuit RST and the PMOS transistor P13. Since, therefore, the circuit can be operated in a state close to the steady state at the beginning of its step-down operation, it has the advantage of improving in operating efficiency.

In order to generate a negative voltage Vbb from the circuit illustrated in FIG. 5, it has only to be so constituted that the NMOS transistors are replaced by PMOS transistors and the power supply voltages Vcc are set at a ground voltage of 0V.

Figure 18:
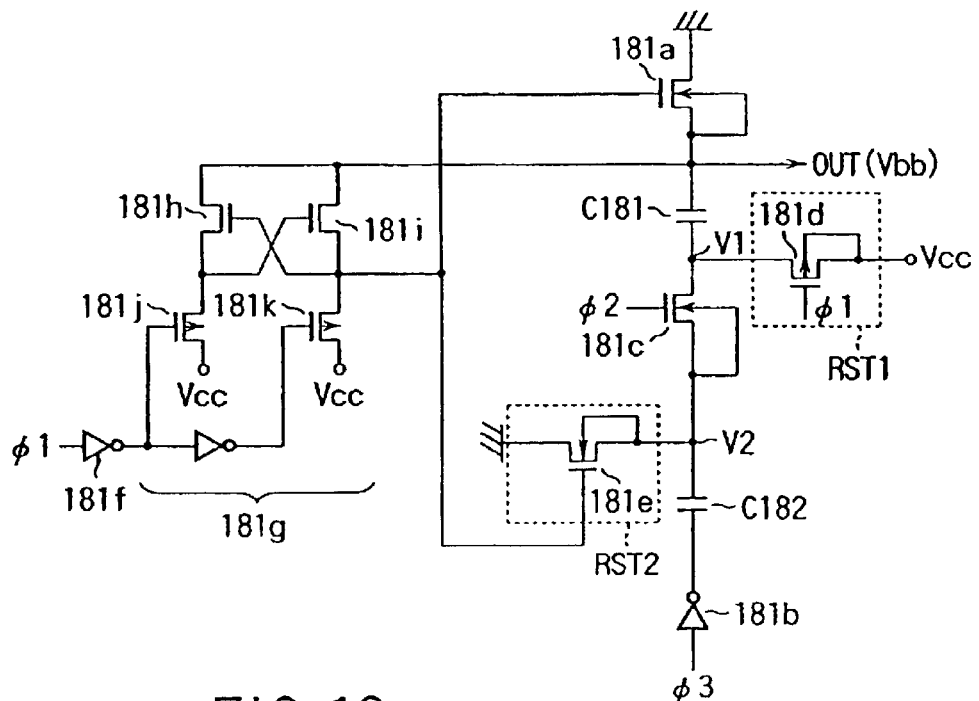
FIG. 18 is a circuit diagram of a negative voltage generating circuit according to a seventh embodiment of the present invention.

FIG. 18 shows a negative voltage generating circuit according to a seventh embodiment of the present invention. This negative voltage generating circuit is a modification to the circuit illustrated in FIG. 7.

Referring to FIG. 18, an NMOS transistor 181a is connected between an output node OUT and a ground. An inverter circuit 181b, a capacitor C182, an NMOS transistor 181c, and a capacitor C181 are connected in series between the input terminal of a signal φ43 and the output node OUT. The gate of the NMOS transistor 181c is supplied with a signal φ2. A PMOS transistor 181d is connected between the ground and a connection node V1 of the NMOS transistor 181c and capacitor C181. The gate of the PMOS transistor 181d is supplied with a capacitor reset signal φ1. An NMOS transistor 181e is connected between the ground and a connection node V2 of the capacitor C182 and NMOS transistor 181c. The gate of the NMOS transistor 181e is connected to that of the NMOS transistor 181a. The signal φ1 is supplied to a level conversion circuit 181g through an inverter circuit 181f. One end of each of current paths of NMOS transistors 181h and 181i constituting the level conversion circuit 181g is connected to the output node OUT. The other ends of the current paths of the transistors 181h and 181i and the gates thereof are each connected to a corresponding one end of each of current paths of PMOS transistors 181j and 181k. The other ends of the current paths of the transistors 181j and 181k are supplied with a power supply voltage Vcc. The connection node of the transistors 181*i* and 181*k*, which serves as an output terminal of the level conversion circuit 181*g*, is connected to the gates of the transistors 181*a* and 181*e*.

Figure 19:
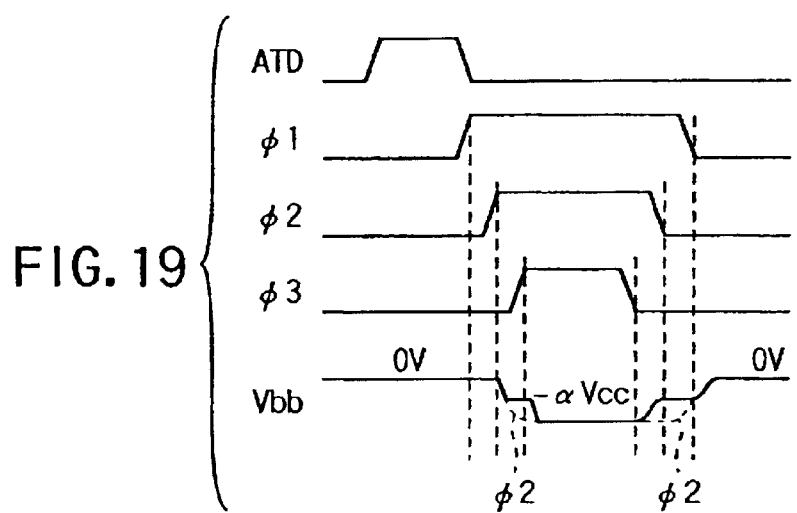
FIG. 19 is a waveform chart showing an operation of the negative voltage generating circuit of FIG. 18.

The operation of the above negative voltage generating circuit is basically the same as that of the circuit shown in FIG. 7. As illustrated in FIG. 19, the signals φ1, φ2 and φ3 are set at a low level, the transistors 181*a*, 181*e* and 181*d* are turned on, and the transistor 181*c* is turned off. Thus, the output node OUT and connection node V2 are each set at 0V, and the connection node V1 is charged to the power supply voltage Vcc.

In this state, the capacitor reset signal φ1 is set at a high level in response to a pulse signal ATD output from an address transition detection circuit, and the transistors 181*a*, 181*d* and 181*e* are turned off in response to the signal φ1. If, then, the signal φ2 is set at a high level, the transistor 181*c* is turned on and the capacitors C181 and C182 are connected to each other. The output node OUT is thus slightly decreased in potential. If the level of the signal φ3 becomes high, the voltage of the output node OUT drops to Vbb. By connecting the two capacitors C181 and C182 in series, a constant −α indicative of a voltage gain can be set to −2 or more. It is thus possible to generate a booster voltage Vbb (=−αVcc) instantaneously even at a low power supply voltage. If the signals φ3, φ2 and φ1 are then set at a low level in that order, the potential of the output node OUT is set at 0V by an operation opposite to the above.

According to the seventh embodiment, the negative voltage Vbb can be generated by lowering the power supply voltage.

In FIG. 18, the inverter circuit 181*b* is supplied with the signal φ3. The present invention is not limited to this. For example, it can be supplied with the signal φ2 and, in this case, the negative voltage Vbb output from the output node OUT can be controlled in response to the signal φ2 as indicated by the broken lines in FIG. 19. A high-speed operation can thus be performed. Since, moreover, the number of signals can be reduced, the control of the negative voltage can be simplified.

Figure 20:
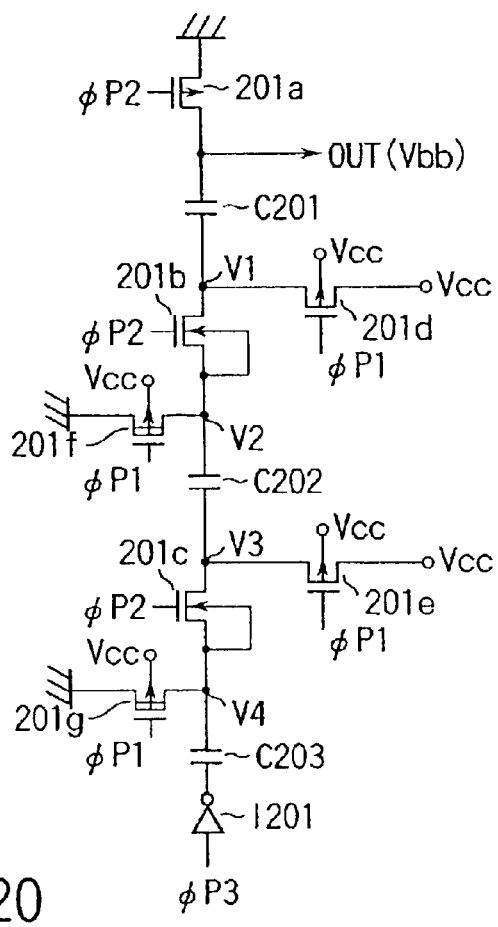
FIG. 20 is a circuit diagram of a negative voltage generating circuit according to an eighth embodiment of the present invention.
Figure 21:
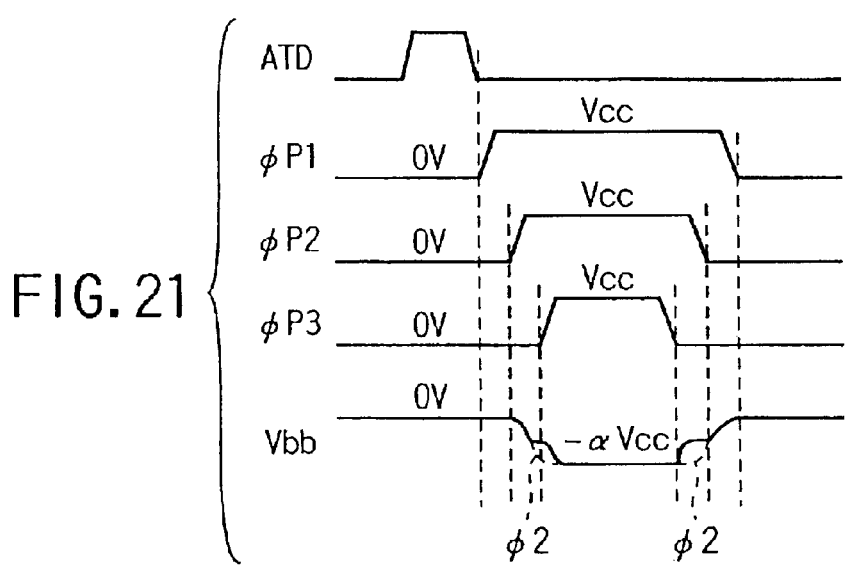
FIG. 21 is a waveform chart showing an operation of the negative voltage generating circuit of FIG. 20.
Figure 22:
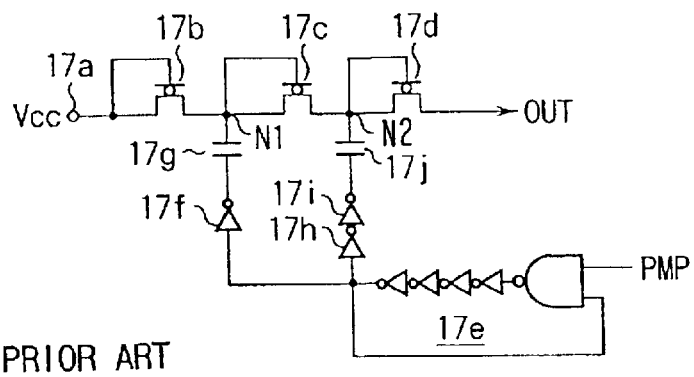
FIG. 22 is a circuit diagram illustrating an arrangement of a prior art booster circuit.
Figure 23:
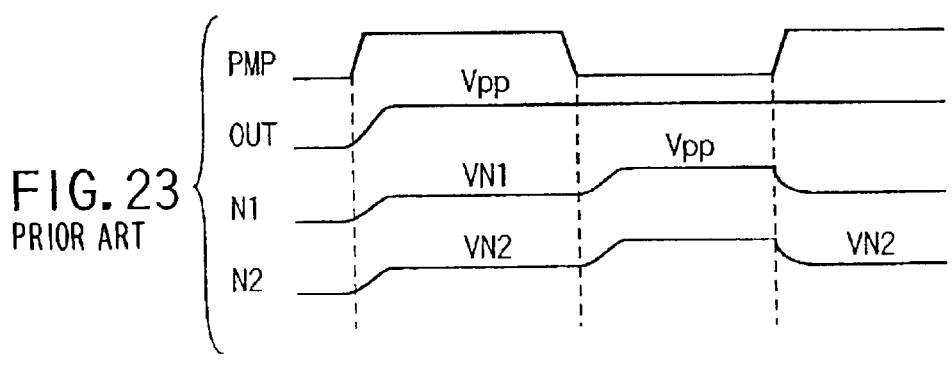
FIG. 23 is a waveform chart showing an operation of the booster circuit of FIG. 22.
Figure 24:
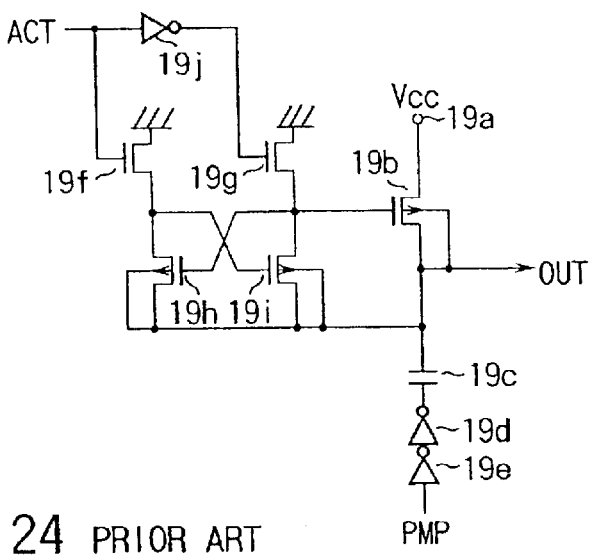
FIG. 24 is a circuit diagram showing an arrangement of another prior art booster circuit.
Figure 25:
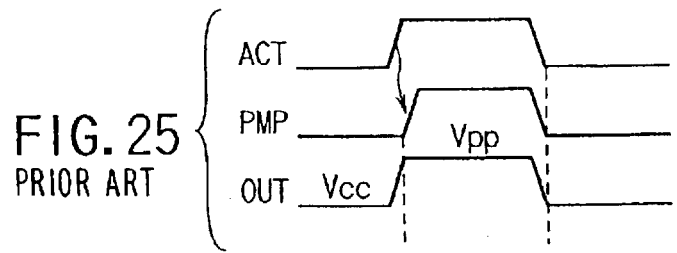
FIG. 25 is a waveform chart showing an operation of the booster circuit of FIG. 24.

FIGS. 20 and 21 illustrate a negative voltage generating circuit according to an eighth embodiment of the present invention. This negative voltage generating circuit is a modification to the circuit shown in FIG. 9. Referring to FIG. 20, a PMOS transistor 201*a* is connected between an output node OUT and a ground. The gate of the PMOS transistor 201*a* is supplied with a signal φP2. An inverter circuit I201, a capacitor C203, an NMOS transistor 201*c*, a capacitor C202, an NMOS transistor 201*b* and a capacitor C201 are connected in series between the input terminal of a signal φP3 and the output node OUT. The gates of the NMOS transistors 201*b* and 201*c* are supplied with a signal φP2 having a level of a power supply voltage Vcc when the signal is at a logic high. The substrate of the NMOS transistor 201*b* is connected to a connection node V2 of the capacitor C202 and NMOS transistor 201*b*, and that of the NMOS transistor 201*c* is connected to a connection node V4 of the capacitor C203 and NMOS transistor 201*c*.

A PMOS transistor 201*d* is connected between a connection node V1 of the NMOS transistor 201*b* and capacitor C201 and a terminal to which a power supply voltage Vcc is applied. A PMOS transistor 201*e* is connected between a connection node V3 of the NMOS transistor 201*c* and capacitor C202 and a terminal to which a power supply voltage Vcc is applied. The gates of the PMOS transistors 201*d* and 201*e* are supplied with a capacitor reset signal φP1.

A PMOS transistor 201*f* of a depletion type is connected between the connection node V2 and the ground, and a PMOS transistor 201*g* of a depletion type is connected between the connection node V4 and the ground. The gates of the PMOS transistors 201*f* and 201*g* are supplied with a capacitor reset signal φP1.

The operation of the negative voltage generating circuit illustrated in FIG. 20 will now be described with reference to FIG. 21. In the standby mode, the signals φP1, φP2 and φP3 are set at 0V, and the PMOS transistors 201*a*, 201*d*, 201*e*, 201*f* and 201*g* are turned on while the NMOS transistors 201*b* and 201*c* are turned off. The output node OUT is thus grounded through the transistor 201*a*. The connection nodes V1 and V3 are charged to the power supply voltage Vcc through the transistors 201*d* and 201*e*, and the connection nodes V2 and V4 are grounded through the transistors 201*f* and 201*g*.

If a pulse signal ATD is output in the above state, the signals φP1, φP2 and φP3 are sequentially set at a high level in response to the pulse signal ATD. For this reason, the transistors 201*d*, 201*e*, 201*f* and 201*g* are first turned off, and then the transistor 201*a* is turned off and the transistors 201*b* and 201*c* are turned on in response to the signal φP2. The capacitors C201, C202 and C203 are thus connected in series through the transistors 201*b* and 201*c*. The voltage of the output node OUT therefore becomes somewhat lower than 0V. If, in this state, the signal φP3 is set at a high level, the voltage of the output node OUT is dropped to Vbb. By connecting the three capacitors C201, C202 and C203 in series, a constant −α indicative of a voltage gain can be set to −3 or more. It is thus possible to generate a booster voltage Vbb (=−αVcc) instantaneously even when a power supply voltage is much lower. If the signals φP3, φP2 and φP1 are then set at a high level in that order, the potential of the output node OUT is set at 0V by an operation opposite to the above.

According to the eighth embodiment, the negative voltage Vbb can be generated by lowering the power supply voltage.

In FIG. 20, the inverter circuit I201 can be controlled by using the signal φP2 in place of the signal φP3. In this case, the negative voltage Vbb output from the output node OUT can be controlled in response to the signal φP2 as indicated by the broken lines in FIG. 21. A high-speed operation can thus be performed. Since, moreover, the number of signals can be reduced, the control of the negative voltage can be simplified.

The present invention can be applied not only to a writable semiconductor memory such as an EEPROM having a booster circuit and a negative voltage generating circuit, a flash EEPROM, a DRAM, an SRAM and a ferroelectric memory, but also to a generally-used semiconductor memory including a booster circuit and a negative voltage generating circuit such as a ROM having a booster circuit and a negative voltage generating circuit and an analog integrated circuit having a booster circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory device comprising:
   a row decoder which selects a word line in accordance with an address signal;

a column decoder which selects a bit line in accordance with the address signal; and a pump circuit having an output node connected to the row decoder, the pump circuit including a first booster circuit configured to boost a first voltage in response to a first signal and to generate a first boost voltage, the first booster circuit outputting the first boost voltage to the output node;

a first detector connected to the output node, configured to compare a first divided voltage divided out of the first boost voltage and a reference voltage, and to generate the first signal for operating the first booster circuit when the first divided voltage is lower than the reference voltage;

a second booster circuit configured to boost the first voltage in response to a second signal and to generate a second boost voltage, the second booster circuit outputting the second boost voltage to the output node; and a second detector connected to the output node and operating in response to an active signal generated in response to a change in the address signal, the second detector being configured to compare a second divided voltage divided out of the second boost voltage and the reference voltage, and to generate the second signal for operating the second booster circuit when the second divided voltage is lower than the reference voltage, wherein the row decoder selects the word line after the second detector is activated in response to the active signal.

2. The memory device according to claim 1, wherein the output node is connected to the column decoder.

3. The memory device according to claim 1, wherein the first booster circuit comprises:

a plurality of transistors connected in series between a power supply terminal and the output node;

at least one capacitor having a first terminal and a second terminal, the first terminal of the at least one capacitor, being connected to a respective connection node of the plurality of transistors; and an oscillator which supplies a signal to the second terminal of the at least one capacitor.

4. The memory device according to claim 1, wherein the second booster circuit comprises:

a plurality of transistors connected in series between a power supply terminal and the output node;

at least one capacitor having a first terminal and a second terminal, the first terminal of the at least one capacitor being connected to a respective connection node of the plurality of transistors; and an oscillator which supplies a signal to the second terminal of the at least one capacitor.

5. The memory device according to claim 4, wherein said second booster circuit further comprises a reset circuit connected to at least one internal node of said second booster circuit, the at least one internal node being supplied with the first boost voltage from said first booster circuit when said second booster circuit stops a boost operation, said reset circuit resetting the at least one internal node to a reset voltage which is lower than the first boost voltage when a logic level of the active signal is changed.

6. The memory device according to claim 5, wherein said reset circuit comprises:

a reset signal generation circuit which generates a reset signal in response to the second signal output from said second detector; and a transistor having a current path, a first end of which is connected to the at least one internal node and a second end of which is supplied with the reset voltage, and having a gate supplied with the reset signal from said reset signal generation circuit, the transistor turning on in response to the reset signal to reset the at least one internal node to the reset voltage.

7. The memory device according to claim 1, wherein the first boost voltage and the second boost voltage are equal to each other.

8. The memory device according to claim 1, wherein said first detector comprises:

a first resistance divider circuit which divides the first boost voltage output from said first booster circuit; and a first comparator which compares the first boost voltage divided by said first resistance divider circuit with the reference voltage.

9. The memory device according to claim 1, wherein said second detector comprises:

a resistance divider circuit which divides the second boost voltage output from said second booster circuit; and a comparator which compares the second boost voltage divided by the resistance divider circuit with the reference voltage.

10. The memory device according to claim 1, wherein the memory device is an EEPROM.

11. The memory device according to claim 1, wherein the second boost voltage which is output from said second booster circuit is supplied to the word line selected by the row decoder, and data stored in at least one memory cell connected with the selected word line is read out.

12. The memory device according to claim 8, wherein said second booster circuit comprises:

a plurality of transistors connected in series between a power supply terminal and the output node;

at least one capacitor having a first terminal and a second terminal, the first terminal of the at least one capacitor being connected to a respective connection node of said plurality of transistors; and an oscillator which supplies a signal to the second terminal of the at least one capacitor, wherein said second detector is connected between the output node and said oscillator, which detects a level of the second boost voltage output from the output node when the active signal is at a first logic, and generates the second signal for activating said oscillator and supplies the second signal to said oscillator when the detected level of the second boost voltage is lower than the reference voltage.

13. The memory device according to claim 12, wherein said second detector comprises:

a second resistance divider circuit which divides the second boost voltage output from the output node, the first resistance divider circuit having a divided resistance ratio which is set lower than a divided resistance ratio of the second resistance divider circuit; and a second comparator which compares the second boost voltage divided by the second resistance divider circuit with the reference voltage.

14. The memory device according to claim 3, wherein the first signal generated by the first detector is supplied to the oscillator.

15. The memory device according to claim 4, wherein the second signal generated by the second detector is supplied to the oscillator.

16. The memory device according to claim 1, wherein the first boost voltage is lower than the second boost voltage.

17. A memory device comprising:

a row decoder which selects a word line in accordance with an address signal;

a column decoder which selects a bit line in accordance with the address signal; and a pump circuit, the pump circuit including a first oscillator which oscillates a first signal;

a first booster circuit configured to boost a first voltage in response to the first signal supplied from the first oscillator and to generate a first boost voltage, the first booster circuit outputting the first boost voltage to an output node;

a first detector connected to the output node, configured to compare a first divided voltage divided out of the first boost voltage and a reference voltage, and to generate a second signal for operating the first oscillator when the first divided voltage is lower than the reference voltage;

a second oscillator which oscillates a third signal;

a second booster circuit configured to boost the first voltage in response to the third signal supplied from the second oscillator and to generate a second boost voltage, the second booster circuit outputting the second boost voltage to the output node; and a second detector connected to the output node and operating in response to an active signal generated in response to a change in the address signal, the second detector being configured to compare a second divided voltage divided out of the second boost voltage and the reference voltage, and to generate a fourth signal for operating the second oscillator when the second divided voltage is lower than the reference voltage, wherein the row decoder selects the word line after the second detector is activated.

18. A pump circuit for a memory device having a row decoder selecting a word line in accordance with an address signal and a column decoder selecting a bit line in accordance with the address signal, the pump circuit comprising:

a first booster circuit configured to boost a first voltage in response to a first signal and to generate a first boost voltage, the first booster circuit outputting the first boost voltage to an output node;

a first detector connected to the output node, configured to compare a first divided voltage divided out of the first boost voltage and a reference voltage, and to generate the first signal for operating the first booster circuit when the first divided voltage is lower than the reference voltage;

a second booster circuit configured to boost the first voltage in response to a second signal and to generate a second boost voltage, the second booster circuit outputting the second boost voltage to the output node; and a second detector connected to the output node and operating in response to an active signal generated in response to a change in the address signal, the second detector being configured to compare a second divided voltage divided out of the second boost voltage and the reference voltage, and to generate the second signal for operating the second booster circuit when the second divided voltage is lower than the reference voltage.

19. The pump circuit according to claim 10, wherein the row decoder selects the word line after the second detector is activated in response to the active signal.

20. A pump circuit for a memory device having a row decoder selecting a word line in accordance with an address signal and a column decoder selecting a bit line in accordance with the address signal, the pump circuit comprising:

a first oscillator which oscillates a first signal;

a first booster circuit configured to boost a first voltage in response to the first signal supplied from the first oscillator and to generate a first boost voltage, the first booster circuit outputting the first boost voltage to an output node;

a first detector connected to the output node, configured to activate the first oscillator when a first divided voltage, which is divided out of the first boost voltage supplied from the output node, is lower than a reference voltage;

a second oscillator which oscillates a second signal;

a second booster circuit configured to boost the first voltage in response to the second signal supplied from the second oscillator, and to generate a second boost voltage, the second booster circuit outputting the second boost voltage to the output node; and a second detector connected to the output node and operating in response to an active signal generated in response to a change in the address signal, the second detector being configured to detect the second boost voltage of the output node and to generate a signal for activating the second oscillator when a second divided voltage, which is divided out of the second boost voltage, is lower than the reference voltage.

21. The pump circuit according to claim 20, wherein the row decoder selects the word line after the second detector is activated in response to the active signal.

* * * * *

UNITED STATES PATENT AND TRADEMARK OFFICE
CERTIFICATE OF CORRECTION

PATENT NO. : 6,781,439 B2
DATED : August 24, 2004
INVENTOR(S) : Toru Tanzawa

It is certified that error appears in the above-identified patent and that said Letters Patent is hereby corrected as shown below:

Column 2,
Line 15, "The pump circuit according to claim 10...", should be replaced with -- The pump circuit according to claim 18... --.

Signed and Sealed this

Fourteenth Day of June, 2005

JON W. DUDAS
*Director of the United States Patent and Trademark Office*